(12) United States Patent
Numata et al.

(10) Patent No.: US 8,407,870 B2
(45) Date of Patent: Apr. 2, 2013

(54) PIEZOELECTRIC VIBRATOR MANUFACTURING METHOD, PIEZOELECTRIC VIBRATOR, OSCILLATOR, ELECTRONIC DEVICE, AND RADIO-CONTROLLED TIMEPIECE

(75) Inventors: Masashi Numata, Chiba (JP); Kazuyoshi Sugama, Chiba (JP); Hiroshi Higuchi, Yokkaichi (JP)

(73) Assignee: Seiko Instruments Inc., Chiba (JP)

( * ) Notice: Subject to any disclaimer, the term of this patent is extended or adjusted under 35 U.S.C. 154(b) by 288 days.

(21) Appl. No.: 12/978,028

(22) Filed: Dec. 23, 2010

(65) Prior Publication Data

US 2011/0140793 A1 Jun. 16, 2011

Related U.S. Application Data

(63) Continuation of application No. PCT/JP2009/060543, filed on Jun. 9, 2009.

(30) Foreign Application Priority Data

Jun. 24, 2008 (JP) ................................. 2008-164662

(51) Int. Cl.
*H01L 41/04* (2006.01)
(52) U.S. Cl. .................... 29/25.35; 331/156; 310/344
(58) Field of Classification Search .................. 331/156, 331/158, 68; 310/344, 470; 29/25.35
See application file for complete search history.

(56) References Cited

U.S. PATENT DOCUMENTS

| 7,675,224 B2 * | 3/2010 | Tanaya ........................... 310/370 |
| 2010/0123369 A1 * | 5/2010 | Ono et al. ....................... 310/348 |

FOREIGN PATENT DOCUMENTS

| JP | 2002-124845 A | 4/2002 |
| JP | 2003-209198 A | 7/2003 |
| JP | 2006-279872 A | 10/2006 |

OTHER PUBLICATIONS

International Search Report for International Application No. PCT/JP2009/060543, dated Jul. 14, 2009, 1 page.

* cited by examiner

*Primary Examiner* — Joseph Chang
(74) *Attorney, Agent, or Firm* — Brinks Hofer Gilson & Lione

(57) ABSTRACT

Provided is a method for manufacturing a high-quality piezoelectric vibrator in which reliable air-tightness of the inside of the cavity is maintained, and stable conduction between the piezoelectric vibrating reed and the outer electrodes is secured. The manufacturing method includes a penetration hole forming step of forming a plurality of penetration holes 30 on a base substrate wafer 40; a core portion insertion step of inserting core portions 7 of a rivet member 9 into the penetration holes from one side of the wafer; a melting step of bringing the rear surface of the base portion 8 of the rivet member into contact with the wafer to close the opening end on the one side of the penetration holes, heating the wafer while pressing the other side of the wafer so as to melt a surface portion on the other side of the wafer to produce a liquid base substrate material 41, and causing the material to flow into gaps between the inner circumferential walls of the penetration holes and the rivet member from the other side of the penetration holes so as to close the gaps; a curing step of cooling and curing the material poured into the gaps; and a polishing step of removing the base portion and polishing the wafer and the rivet member so that the base substrate wafer and the core portion are planarized.

11 Claims, 23 Drawing Sheets

PIEZOELECTRIC VIBRATOR MANUFACTURING METHOD, PIEZOELECTRIC VIBRATOR, OSCILLATOR, ELECTRONIC DEVICE, AND RADIO-CONTROLLED TIMEPIECE

RELATED APPLICATIONS

This application is a continuation of PCT/JP2009/060543 filed on Jun. 9, 2009, which claims priority to Japanese Application No. 2008-164662 filed on Jun. 24, 2008. The entire contents of these applications are incorporated herein by reference.

BACKGROUND OF THE INVENTION

1. Field of the Invention

The present invention relates to a method for manufacturing a surface mount device (SMD)-type piezoelectric vibrator in which a piezoelectric vibrating reed is sealed in a cavity that is formed between two bonded substrates, a piezoelectric vibrator manufactured by the manufacturing method, and an oscillator, an electronic device, and a radio-controlled timepiece each having the piezoelectric vibrator.

2. Description of the Related Art

Recently, a piezoelectric vibrator utilizing quartz or the like has been used in cellular phones and portable information terminals as a time source, a timing source of a control signal, a reference signal source, and the like. There are various piezoelectric vibrators of this type, and a surface mount device-type piezoelectric vibrator is one known example thereof. As a piezoelectric vibrator of this type, a three-layered piezoelectric vibrator in which a piezoelectric substrate having a piezoelectric vibrating reed formed thereon is bonded to a base substrate and a lid substrate so as to be interposed therebetween is generally known. In this case, the piezoelectric vibrator is accommodated in a cavity (sealed space) that is formed between the base substrate and the lid substrate. Moreover, in recent years, instead of the three-layered piezoelectric vibrator described above, a two-layered piezoelectric vibrator has also been developed.

The piezoelectric vibrator of this type has a two-layered structure in which a base substrate and a lid substrate are directly bonded, and a piezoelectric vibrating reed is accommodated in a cavity formed between the two substrates.

The two-layered piezoelectric vibrator is ideally used as it is superior in achieving a thin profile as compared with the three-layered structure. As an example of such a two-layered piezoelectric vibrator, there is known a piezoelectric vibrator in which using a conductive member formed so as to penetrate through the base substrate, the piezoelectric vibrating reed is electrically connected to the outer electrodes formed on the base substrate (see Patent Citations 1 and 2).

As shown in FIGS. 33 and 34, this piezoelectric vibrator 200 includes a base substrate 201 and a lid substrate 202 which are anodically bonded to each other with a bonding film 207 disposed therebetween, and a piezoelectric vibrating reed 203 which is sealed in a cavity C formed between the two substrates 201 and 202. The piezoelectric vibrating reed 203 is a tuning-fork vibrating reed, for example, and is mounted on the upper surface of the base substrate 201 inside the cavity C by a conductive adhesive agent E.

The base substrate 201 and the lid substrate 202 are insulating substrates formed, for example, from ceramics, glass, and the like. On the base substrate 201 among the two substrates 201 and 202, through-holes 204 are formed so as to penetrate through the substrate 201. Inside the through-holes 204, a conductive member 205 is buried so as to close the through-holes 204. The conductive member 205 is electrically connected to outer electrodes 206 which are formed on the lower surface of the base substrate 201 and are also electrically connected to the piezoelectric vibrating reed 203 which is mounted inside the cavity C.

Patent Citation 1: JP-A-2002-124845
Patent Citation 2: JP-A-2006-279872

However, in the two-layered piezoelectric vibrator described above, the conductive member 205 has two major roles: one is to close the through-holes 204 to maintain the air-tightness of the inside of the cavity C, and the other is to electrically connect the piezoelectric vibrating reed 203 and the outer electrodes 206 to each other. Particularly, if the adhesion to the through-holes 204 is not sufficient, there is a problem in that the air-tightness of the inside of the cavity C is degraded. Moreover, if the contact with the conductive adhesive agent E or the outer electrodes 206 is not sufficient, there is a problem in that operation errors of the piezoelectric vibrating reed 203 may be caused. Therefore, in order to obviate such a problem, it is necessary to form the conductive member 205 so as to completely close the through-holes 204 in a state of being tightly adhered to the inner surfaces of the through-holes 204 and in a state where no depression or the like is present on the surface thereof.

Although Patent Citations 1 and 2 disclose the use of the conductive member 205 which is formed from a conductive paste (an Ag paste, an Au—Sn paste, or the like), there is no disclosure as to a specific manufacturing method of how the conductive member 205 was actually formed.

In general, when a conductive paste is used, it needs to be baked and cured. That is, it is necessary to bury a conductive paste in the through-holes 204 and then cure the conductive paste by baking. However, if baking is performed, an organic material included in the conductive paste will disappear by evaporation. Therefore, the volume of the conductive paste after the baking will generally decrease as compared to before the baking (for example, when an Ag paste was used as the conductive paste, the volume decreased by approximately 20%). For this reason, even when the conductive member 205 was formed using the conductive paste, there is a problem in that depressions are formed on the surface thereof, and in severe cases, a penetration hole is opened at the center thereof.

As a result, there is a possibility that the air-tightness of the inside of the cavity C is degraded and the conduction between the piezoelectric vibrating reed 203 and the outer electrodes 206 is degraded.

The present invention has been made in view of the above problems, and an object of the present invention is to provide a piezoelectric vibrator manufacturing method for manufacturing a high-quality two-layered surface mount device-type piezoelectric vibrator in which reliable air-tightness of the inside of the cavity is maintained, and stable electrical connection between the piezoelectric vibrating reed and the outer electrodes is secured. Another object of the present invention is to provide a piezoelectric vibrator manufactured by the manufacturing method and an oscillator, an electronic device, and a radio-controlled timepiece each including the piezoelectric vibrator.

SUMMARY OF THE INVENTION

The present invention provides the following means in order to solve the problems.

A method for manufacturing a plurality of piezoelectric vibrators at a time using a base substrate wafer, a lid substrate wafer, a conductive rivet member having a planar base portion and core portions extending from a rear surface of the base portion, the piezoelectric vibrators each including a base substrate, a lid substrate bonded to the base substrate in a state where a cavity is formed between the base substrate and the lid substrate, a piezoelectric vibrating reed bonded to an upper surface of the base substrate in a state of being received in the cavity, outer electrodes formed on a lower surface of the base substrate, and penetration electrodes formed so as to penetrate through the base substrate in a vertical direction so that the piezoelectric vibrating reed is electrically connected to the outer electrodes, includes: at the time of forming the penetration electrodes, a penetration hole forming step of forming a plurality of penetration holes on the base substrate wafer so as to penetrate through the base substrate wafer in the vertical direction; a core portion insertion step of inserting the core portions of the rivet member into the respective penetration holes from one side of the base substrate wafer; a melting step of bringing the rear surface of the base portion of the rivet member into contact with the base substrate wafer so as to close an opening end on the one side of the penetration holes, heating the base substrate wafer while pressing the other side of the base substrate wafer so as to melt a surface portion on the other side of the base substrate wafer to produce a liquid base substrate material, and causing the base substrate material to flow into gaps between the inner circumferential walls of the penetration holes and the rivet member from the other side of the penetration holes so as to close the gaps; a curing step of cooling and curing the base substrate material poured into the gaps to fix the base substrate wafer and the rivet member to be integral with each other; and a polishing step of removing the base portion of the rivet member and polishing the base substrate wafer and the rivet member so that the base substrate wafer and the core portion are planarized.

In the piezoelectric vibrator manufacturing method according to the above aspect of the present invention, when the penetration electrodes are formed, first, in the penetration hole forming step, a plurality of penetration holes is formed on the base substrate wafer so as to penetrate through the base substrate wafer in the vertical direction.

Subsequently, in the core portion insertion step, the core portions of the rivet member are inserted into the respective penetration holes from one side of the base substrate wafer.

Subsequently, in the melting step, the gaps between the inner circumferential walls of the penetration holes and the rivet member are closed. At that time, the rear surface of the base portion of the rivet member is brought into contact with the base substrate wafer so as to close an opening end on the one side of the penetration holes. Moreover, the base substrate wafer is heated while pressing the other side of the base substrate wafer so as to melt a surface portion on the other side of the base substrate wafer to produce a liquid base substrate material, and the base substrate material is caused to flow into gaps from the other side of the penetration holes. In this way, the base substrate material can be laminated on the rear surface of the base portion which closes the opening end on the one side, and the gaps can be closed.

Subsequently, in the curing step, the base substrate material poured into the gaps is cured. In this way, the base substrate wafer and the rivet member can be fixed to be integral with each other.

Particularly, since the base substrate material is cured by cooling, it is possible to suppress a decrease in the volume as compared to a case of burying and baking a paste, prevent the formation of holes in the course of curing, and reliably seal the penetration holes.

Subsequently, in the polishing step, the base substrate wafer and the rivet member are polished. At that time, the base portion of the rivet member is removed, and the base substrate wafer and the core portions are polished to be flat. As a result, the core portions serve as the penetration electrodes.

Particularly, since the base substrate wafer and the penetration electrodes are flat, a conductive adhesive agent, an electrode film, or the like can be formed in a state of being closely adhered to the penetration electrodes. As a result, even when the piezoelectric vibrating reed is electrically connected to the penetration electrodes via a conductive adhesive agent, an electrode film, or the like, it is possible to secure stable conduction between the piezoelectric vibrating reed and the outer electrodes and improve the reliability of an operation performance and achieve a high quality. In addition, since the penetration electrodes are configured using the conductive core portions, extremely stable conduction can be obtained.

Moreover, since the formation of holes in the base substrate wafer in the course of sealing the penetration holes is prevented, it is possible to prevent degradation of the air-tightness of the inside of the cavity. In this respect, it is possible to achieve a high quality.

In the piezoelectric vibrator manufacturing method according to the above aspect of the present invention, it is desirable that in the penetration hole forming step, the penetration holes are formed so that the opening end on the other side is larger than the opening end on the one side, and an inner diameter thereof gradually decreases from the other side towards the one side.

In this case, the penetration holes are formed so that the opening end on the other side is larger than the opening end on the one side. Therefore, the base substrate material can be easily poured from the opening end on the other side, and the gaps between the inner circumferential walls of the penetration holes on the one side and the rivet member can be more reliably closed by the poured base substrate material.

In addition, since the penetration holes are formed so that the diameter thereof gradually decreases from the one side towards the other, even when the surface portion on the other side of the base substrate wafer is melted so that the inner circumferential walls forming the penetration holes are melted, the size on the other side of the penetration holes will not decrease abruptly. For this reason, the base substrate material can be smoothly and continuously poured into the penetration holes.

In the piezoelectric vibrator manufacturing method according to the above aspect of the present invention, it is preferable that a rivet member in which a plurality of the core portions is formed on the same base portion is used as the rivet member.

In this case, since a rivet member in which a plurality of core portions is formed on the same base portion is used as the rivet member, the plurality of core portions can be inserted into the penetration holes just by positioning the base portion used in common for the plurality of core portions with respect to the base substrate wafer in the core portion insertion step. Therefore, it is not necessary to position the core portions one by one, and it is possible to improve the workability of the core portion insertion step.

In the piezoelectric vibrator manufacturing method according to the above aspect of the present invention, it is preferable that the melting step includes a setting step of disposing the base substrate wafer in which the rivet member is inserted in a recess portion of a receiving mold in which the recess portion is formed so that the base substrate wafer can be fitted and received therein in a state where the one side of the base substrate wafer faces the receiving mold, thus bringing the rear surface of the base portion of the rivet member to come into contact with the base substrate wafer; and a pressing step of pressing the surface portion on the other side of the base substrate wafer disposed in the recess portion of the receiving mold using a pressurizing mold that applies pressure by pressing the base substrate wafer.

In this case, during the melting step, first, in the setting step, the base substrate wafer in which the rivet member is inserted in the recess portion of the receiving mold is disposed. At that time, the base substrate wafer is disposed in a state where the one side of the base substrate wafer faces the receiving mold so that the rear surface of the base portion of the rivet member is brought into contact with the base substrate wafer.

Subsequently, in the pressing step, the surface portion on the other side of the base substrate wafer disposed in the recess portion of the receiving mold is pressed using the pressurizing mold.

Particularly, pressure can be applied just by pressing the surface portion on the other side of the base substrate wafer with the pressurizing mold. In addition, since the base substrate wafer is fitted and received in the recess portion of the receiving mold, the base substrate wafer will not be misaligned with respect to the pressurizing mold during the pressing with the pressurizing mold, and pressure can be applied reliably by pressing the base substrate wafer.

In the piezoelectric vibrator manufacturing method according to the above aspect of the present invention, it is preferable that in the setting step, a fixing jig that forms a flat surface together with the rear surface of the base portion in a state where the base portion of the rivet member is interposed between the base substrate wafer and the fixing jig is disposed between the base substrate wafer and the receiving mold.

In this case, the fixing jig is disposed between the base substrate wafer and the receiving mold. Since the fixing jig forms a flat surface together with the rear surface of the base portion in a state where the base portion of the rivet member is disposed between the base substrate wafer and the fixing jig, the entirety of the surface on the one side of the base substrate wafer is supported by the flat surface. Therefore, the pressure applied to the other side of the base substrate wafer by the pressurizing mold is distributed to act on the surface on the one side of the base substrate wafer and will not be concentrated at a local position. For this reason, it is possible to suppress the formation of cracks or the like in the base substrate wafer and achieve a high-quality piezoelectric vibrator.

In the piezoelectric vibrator manufacturing method according to the above aspect of the present invention, it is preferable that a rivet member in which the thickness of the core portion is smaller than that of the base substrate wafer is used as the rivet member.

In this case, since a rivet member in which the thickness of the core portion is smaller than that of the base substrate wafer is used as the rivet member, the tip ends of the core portions will not come into contact with the pressurizing mold when the surface of the base substrate wafer is pressed by the pressurizing mold during the pressing step. Therefore, it is not necessary to change the shape of the pressurizing mold for each portion facing the base substrate wafer and to apply pressure with the orientation of the pressurizing mold adjusted in advance, but pressure can be applied just by a pressurizing mold having a flat surface.

In the piezoelectric vibrator manufacturing method according to the above aspect of the present invention, it is preferable that a pressurizing mold in which a core portion insertion hole having approximately the same inner diameter as the outer diameter of the core portion is formed at a position facing the core portion of the rivet member during the pressing step is used as the pressurizing mold.

In this case, a pressurizing mold in which a core portion insertion hole having approximately the same inner diameter as the outer diameter of the core portion is formed at a position facing the core portion of the rivet member during the pressing step is used as the pressurizing mold. For this reason, even when the thickness of the core portions is larger than the thickness of the base substrate wafer, the tip ends of the core portions will be inserted through the core portion insertion holes and will not come into contact with the pressurizing mold in the course of pressing the base substrate wafer with the pressurizing mold during the pressing step. Therefore, regardless of the thickness of the core portions, the base substrate wafer can be pressed by the pressurizing mold so as to be melted until the surface on the other side of the base substrate wafer becomes flat.

According to another aspect of the present invention, there is provided a piezoelectric vibrator which is manufactured in accordance with the piezoelectric vibrator manufacturing method according to the above aspect of the present invention.

Since the piezoelectric vibrator according to the above aspect of the present invention is manufactured by the piezoelectric vibrator manufacturing method according to the above aspect of the present invention, it is possible to provide a high-quality two-layered surface mount device-type piezoelectric vibrator in which reliable air-tightness of the inside of the cavity is maintained, and stable electrical connection between the piezoelectric vibrating reeds and the outer electrodes is secured.

According to a still further aspect of the present invention, there is provided an oscillator in which the piezoelectric vibrator according to the above aspect of the present invention is electrically connected to an integrated circuit as an oscillating piece.

According to a still further aspect of the present invention, there is provided an electronic device in which the piezoelectric vibrator according to the above aspect of the present invention is electrically connected to a timer portion.

According to a still further aspect of the present invention, there is provided a radio-controlled timepiece in which the piezoelectric vibrator according to the above aspect of the present invention is electrically connected to a filter portion.

Since the oscillator, electronic device, and radio-controlled timepiece according to the above aspects of the present invention include the high-quality piezoelectric vibrator in which the air-tightness of the inside of the cavity is reliable, and the operation reliability is improved, it is similarly possible to enhance the operation reliability and achieve an improvement in the quality thereof.

According to the piezoelectric vibrator manufacturing method of the above aspect of the present invention, it is possible to manufacture a high-quality two-layered surface mount device-type piezoelectric vibrator in which reliable air-tightness of the inside of the cavity can be maintained and stable electrical connection between the piezoelectric vibrating reeds and the outer electrodes is secured.

According to the piezoelectric vibrator according to the above aspect of the present invention, since it is manufactured by the manufacturing method of the above aspect, it is possible to provide a high-quality piezoelectric vibrator.

According to the oscillator, electronic device, and radio-controlled timepiece of the above aspects of the present invention, since they include the piezoelectric vibrator of the above aspect, it is similarly possible to enhance the operation reliability and achieve an improvement in the quality thereof.

DETAILED DESCRIPTION OF THE PREFERRED EMBODIMENTS

Hereinafter, an embodiment of a piezoelectric vibrator according to the present invention will be described with reference to FIGS. 1 to 27.

As shown in FIGS. 1 to 4, a piezoelectric vibrator 1 according to the present embodiment is a surface mount device-type piezoelectric vibrator which is formed in the form of a box laminated in two layers of a base substrate 2 and a lid substrate 3 and in which a piezoelectric vibrating reed 4 is accommodated in a cavity C at an inner portion thereof.

Figure 4:
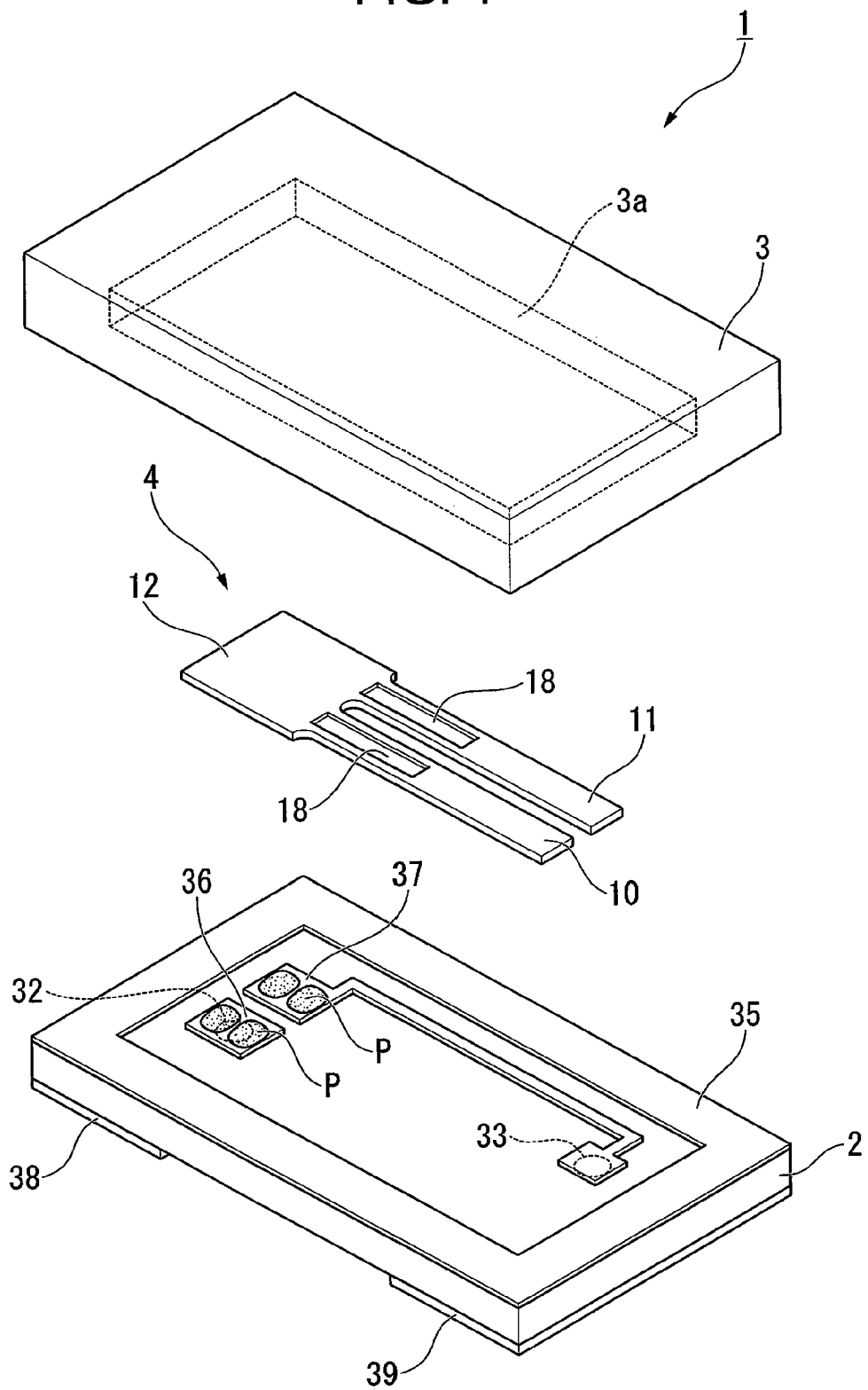
FIG. 4 is an exploded perspective view of the piezoelectric vibrator shown in FIG. 1.

The base substrate 2 and the lid substrate 3 have a thickness of 150 μm to 200 μm, for example. In FIG. 4, for better understanding of the drawings, illustrations of excitation electrode 15, extraction electrodes 19 and 20, mount electrodes 16 and 17, and weight metal film 21 described later are omitted.

Figure 5:
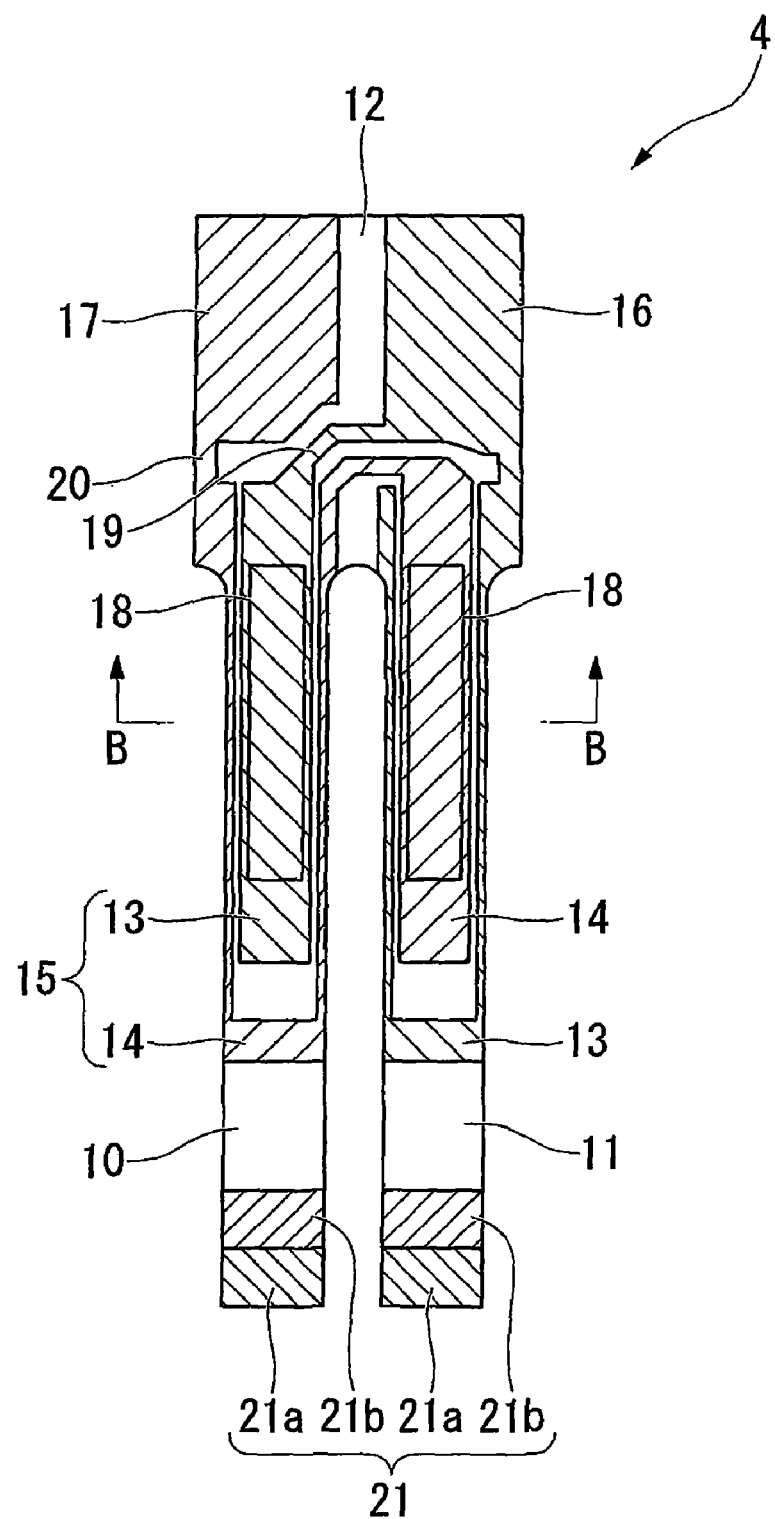
FIG. 5 is a top view of the piezoelectric vibrating reed that constitutes the piezoelectric vibrator shown in FIG. 1.
Figure 6:
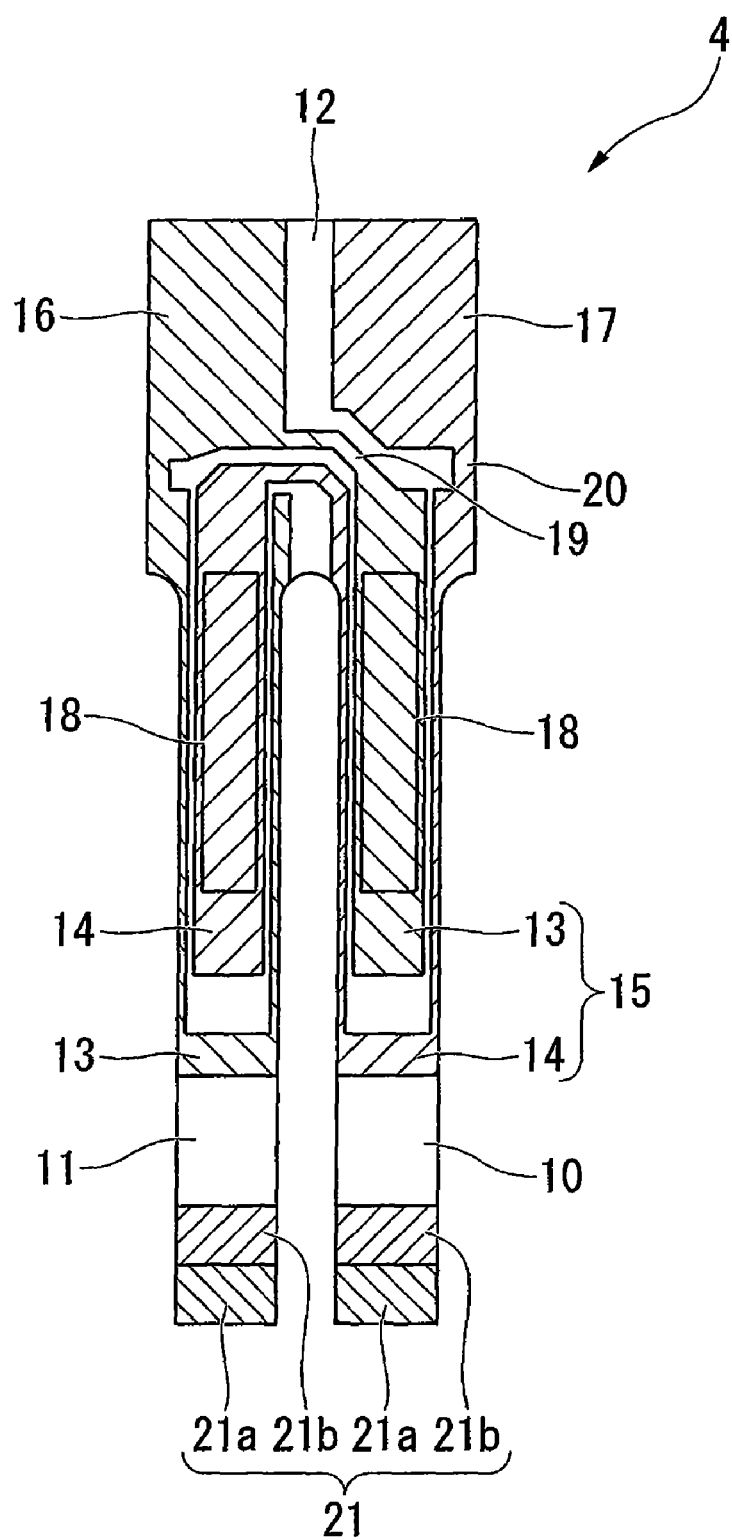
FIG. 6 is a bottom view of the piezoelectric vibrating reed shown in FIG. 5.
Figure 7:
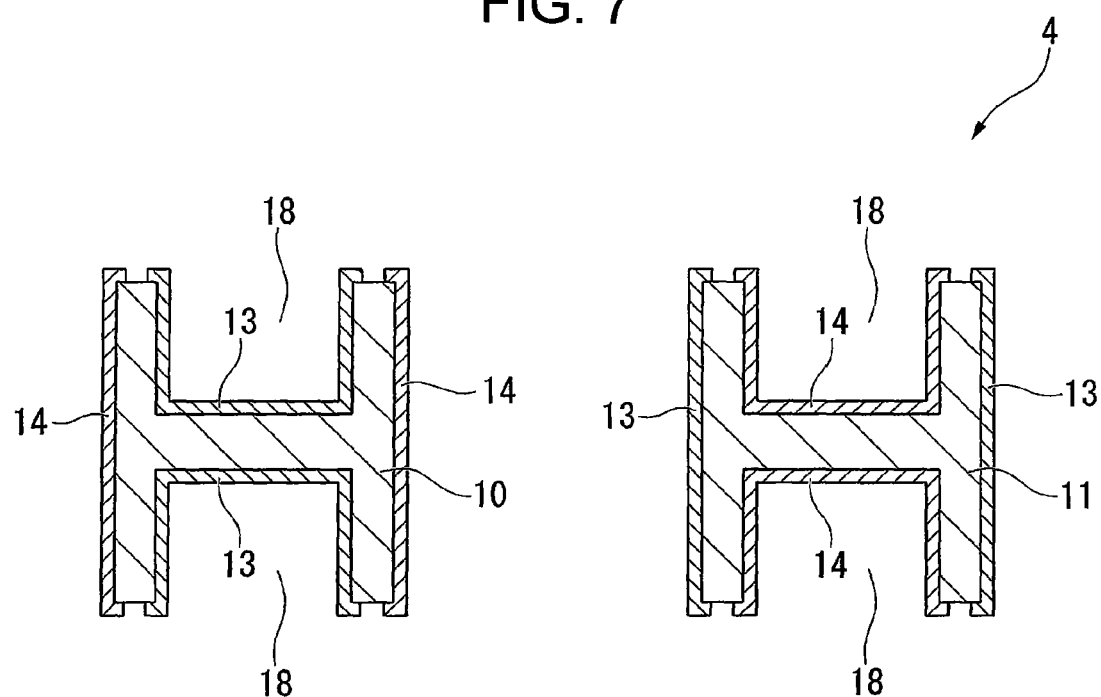
FIG. 7 is a sectional view taken along the arrow B-B in FIG. 5.

As shown in FIGS. 5 to 7, the piezoelectric vibrating reed 4 is a tuning-fork type vibrating reed which is made from a piezoelectric material such as quartz crystal, lithium tantalate, or lithium niobate and is configured to vibrate when a predetermined voltage is applied thereto.

The piezoelectric vibrating reed 4 includes: a pair of vibrating arms 10 and 11 disposed in parallel to each other; a base portion 12 to which the base end sides of the pair of vibrating arms 10 and 11 are integrally fixed; an excitation electrode 15 which is formed on the outer surfaces of the pair of vibrating arms 10 and 11 so as to allow the pair of vibrating arms 10 and 11 to vibrate and includes first and second excitation electrodes 13 and 14; and mount electrodes 16 and 17 which are electrically connected to the first and second excitation electrodes 13 and 14.

In addition, the piezoelectric vibrating reed 4 according to the present embodiment is provided with groove portions 18 which are formed on both principal surfaces of the pair of vibrating arms 10 and 11 along the longitudinal direction of the vibrating arms 10 and 11. The groove portions 18 are formed so as to extend from the base end sides of the vibrating arms 10 and 11 up to approximately the middle portions thereof.

The excitation electrode 15 including the first excitation electrode 13 and the second excitation electrode 14 is an electrode that allows the pair of vibrating arms 10 and 11 to vibrate at a predetermined resonance frequency in a direction to move closer to or away from each other and is patterned on the outer surfaces of the pair of vibrating arms 10 and 11 in an electrically isolated state. Specifically, as shown in FIG. 7, the first excitation electrode 13 is mainly formed on the groove portion 18 of one vibrating arm 10 and both side surfaces of the other vibrating arm 11. On the other hand, the second excitation electrode 14 is mainly formed on both side surfaces of one vibrating arm 10 and the groove portion 18 of the other vibrating arm 11.

Moreover, the first excitation electrode 13 and the second excitation electrode 14 are electrically connected to the mount electrodes 16 and 17 via the extraction electrodes 19 and 20, respectively, on both principal surfaces of the base portion 12 shown in FIGS. 5 and 6. A voltage is applied to the piezoelectric vibrating reed 4 via the mount electrodes 16 and 17.

The above-mentioned excitation electrode 15, mount electrodes 16 and 17, and extraction electrodes 19 and 20 are formed by a coating of a conductive film of chromium (Cr), nickel (Ni), aluminum (Al), and titanium (Ti), for example.

Furthermore, the tip ends of the vibrating arms 10 and 11 are coated with a weight metal film 21 for adjustment of their own vibration states (tuning the frequency) in a manner such as to vibrate within a predetermined frequency range. The weight metal film 21 is divided into a rough tuning film 21a used for tuning the frequency roughly and a fine tuning film 21b used for tuning the frequency finely. By tuning the frequency with the use of the rough tuning film 21a and the fine tuning film 21b, the frequency of the pair of the vibrating arms 10 and 11 can be set to fall within the range of the nominal frequency of the device.

Figure 3:
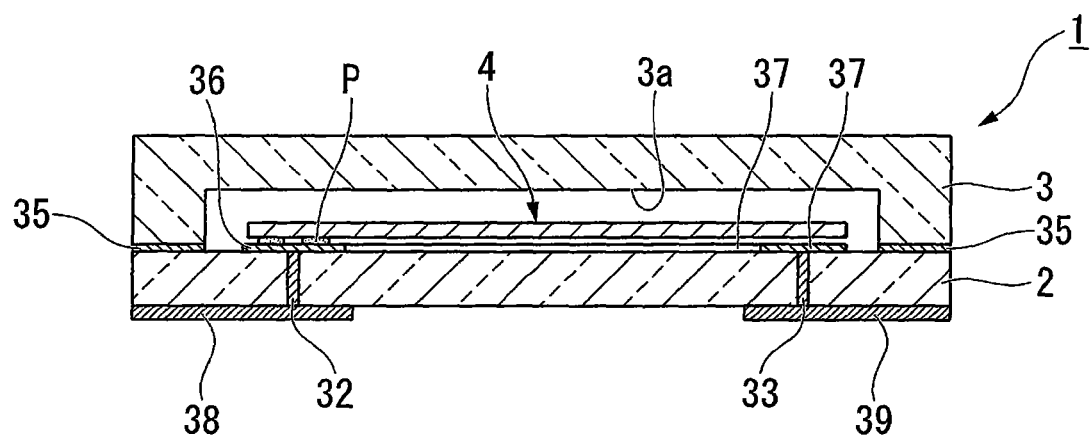
FIG. 3 is a sectional view of the piezoelectric vibrator taken along the line A-A in FIG. 2.

The piezoelectric vibrating reed 4 configured in this way is mounted on an upper surface of the base substrate 2 by bump bonding using bumps P made from gold or the like as shown in FIGS. 3 and 4. More specifically, bump bonding is achieved in a state where the pair of mount electrodes 16 and 17 comes into contact with two bumps P formed on lead-out electrodes 36 and 37 described later, respectively, which are patterned on the upper surface of the base substrate 2. In this way, the piezoelectric vibrating reed 4 is supported in a state of being floated from the upper surface of the base substrate 2, and the mount electrodes 16 and 17 and the lead-out electrodes 36 and 37 are electrically connected to each other.

Figure 1:
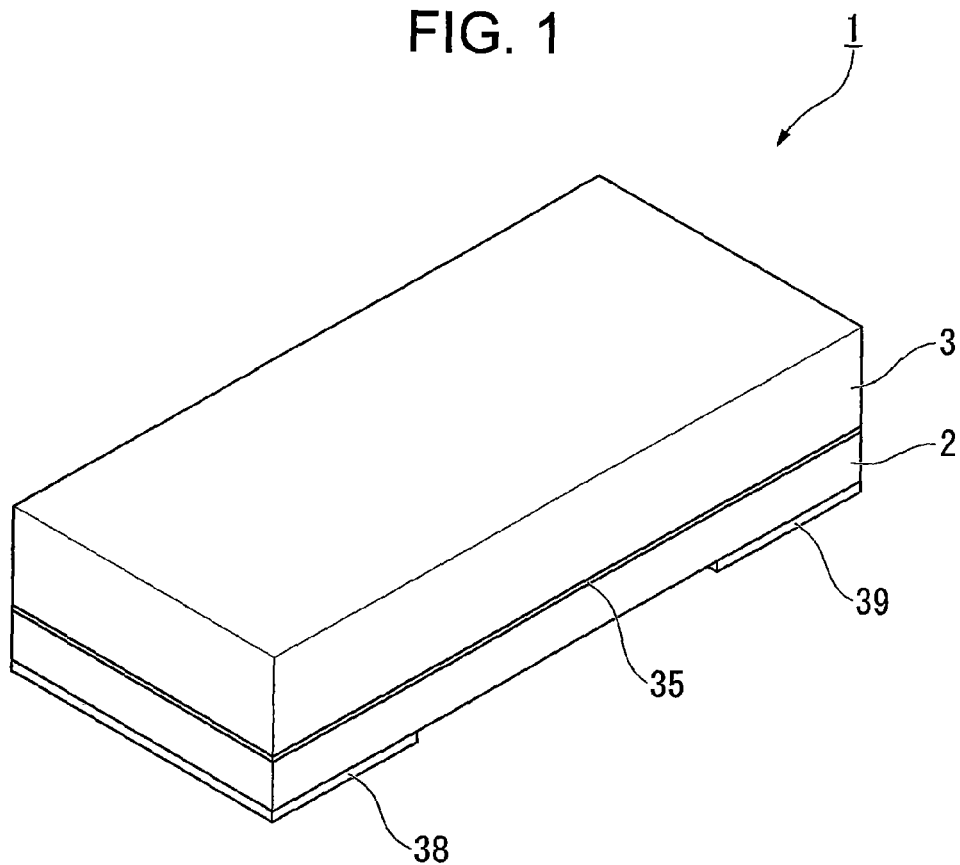
FIG. 1 is a perspective view showing an external appearance of a piezoelectric vibrator according to an embodiment of the present invention.
Figure 2:
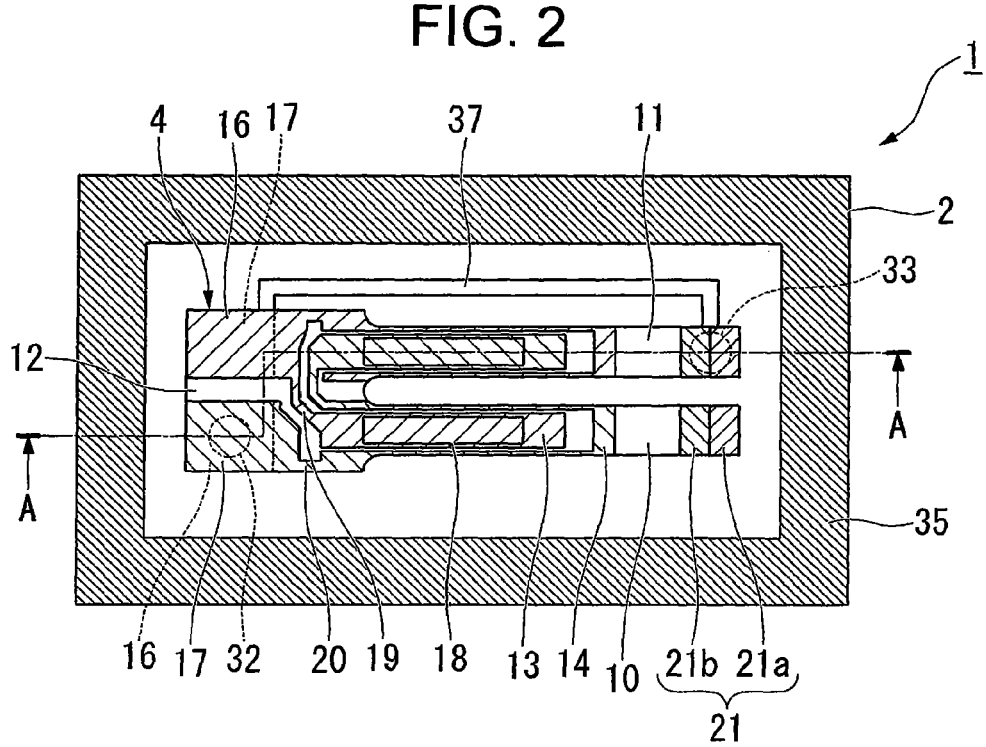
FIG. 2 is a top view showing an inner structure of the piezoelectric vibrator shown in FIG. 1 when a piezoelectric vibrating reed is viewed from above with a lid substrate removed.

The lid substrate 3 is a transparent insulating substrate made from a glass material, for example, soda-lime glass, and is formed in a substrate-like form as shown in FIGS. 1, 3, and 4. On a bonding surface side thereof to be bonded to the base substrate 2, a rectangular recess portion 3a in which the piezoelectric vibrating reed 4 is accommodated is formed. The recess portion 3a is a recess portion for a cavity serving as the cavity C that accommodates the piezoelectric vibrating reed 4 when the two substrates 2 and 3 are superimposed on each other. The lid substrate 3 is anodically bonded to the base substrate 2 in a state where the recess portion 3a faces the base substrate 2.

The base substrate 2 is a transparent insulating substrate made from glass material, for example, soda-lime glass, similarly to the lid substrate 3, and is formed in a substrate-like form having a size capable of being overlapped with the lid substrate 3, as shown in FIGS. 1 to 4.

On the base substrate 2, a pair of penetration electrodes 32 and 33 is formed so as to penetrate through the base substrate 2 in the vertical direction. The pair of penetration electrodes 32 and 33 is formed so as to be received in the cavity C. More specifically, the penetration electrodes 32 and 33 of the present embodiment are formed such that one penetration electrode 32 is positioned close to the base portion 12 of the mounted piezoelectric vibrating reed 4, and the other penetration electrode 33 is positioned close to the tip ends of the vibrating arms 10 and 11.

As shown in FIG. 3, the penetration electrodes 32 and 33 are conductive cylindrical core materials made from metallic material, and have a shape which has flat ends and is formed so as to have approximately the same thickness as the base substrate 2. The penetration electrodes 32 and 33 are formed, for example, from kovar, Dumet wire, and Fe—Ni alloys, and the thermal expansion coefficient thereof is approximately equal to that of the base substrate 2.

The penetration electrodes 32 and 33 serve to maintain the air-tightness of the inside of the cavity C by being disposed so as not to form any gap between the base substrate 2 and the penetration electrodes 32 and 33 and achieve electrical connection between the outer electrodes 38 and 39 described later and the lead-out electrodes 36 and 37. The penetration electrodes 32 and 33 are tightly attached to the base substrate 2 when the melted base substrate 2 (base substrate wafer 40) as described later is cooled and cured.

As shown in FIGS. 1 to 4, on the upper surface side of the base substrate 2 (the bonding surface side to be bonded to the lid substrate 3), a bonding film 35 for anodic bonding and the pair of lead-out electrodes 36 and 37 are patterned by a conductive material (for example, aluminum). Among them, the bonding film 35 is formed along the peripheral edge of the base substrate 2 so as to surround the periphery of the recess portion 3a formed on the lid substrate 3.

The lead-out electrodes 36 and 37 are two-layered electrode films including a lower chromium layer and an upper gold layer, for example, and have a thickness of 2000 Å, for example. Moreover, the pair of lead-out electrodes 36 and 37 is patterned so that one penetration electrode 32 of the pair of penetration electrodes 32 and 33 is electrically connected to one mount electrode 16 of the piezoelectric vibrating reed 4, and the other penetration electrode 33 is electrically connected to the other mount electrode 17 of the piezoelectric vibrating reed 4. More specifically, one lead-out electrode 36 is formed right above the one penetration electrode 32 to be disposed right below the base portion 12 of the piezoelectric vibrating reed 4. Moreover, the other lead-out electrode 37 is formed to be disposed right above the other penetration electrode 33 after being led out from a position near the one lead-out electrode 36 towards the tip ends of the vibrating arms 10 and 11 along the vibrating arms 10 and 11.

The bumps P are formed on the pair of lead-out electrodes 36 and 37, and the piezoelectric vibrating reed 4 is mounted using the bumps P. In this way, the one mount electrode 16 of the piezoelectric vibrating reed 4 is electrically connected to the one penetration electrode 32 via the one lead-out electrode 36, and the other mount electrode 17 is electrically connected to the other penetration electrode 33 via the other lead-out electrode 37.

Moreover, as shown in FIGS. 1, 3, and 4, on the lower surface of the base substrate 2, the outer electrodes 38 and 39 which are electrically connected to the pair of penetration electrodes 32 and 33, respectively, are formed. That is, one outer electrode 38 is electrically connected to the first excitation electrode 13 of the piezoelectric vibrating reed 4 via the one penetration electrode 32 and the one lead-out electrode 36. In addition, the other outer electrode 39 is electrically connected to the second excitation electrode 14 of the piezoelectric vibrating reed 4 via the other penetration electrode 33 and the other lead-out electrode 37.

When the piezoelectric vibrator 1 configured in this manner is operated, a predetermined drive voltage is applied between the pair of outer electrodes 38 and 39 formed on the base substrate 2. In this way, a current can be made to flow to the excitation electrode 15 including the first and second excitation electrodes 13 and 14, of the piezoelectric vibrating reed 4, and the pair of vibrating arms 10 and 11 are allowed to vibrate at a predetermined frequency in a direction to move closer to or away from each other. This vibration of the pair of vibrating arms 10 and 11 can be used as a time source, a timing source of a control signal, a reference signal source, and the like.

Next, prior to a description of a manufacturing method of the above-described piezoelectric vibrator 1, a description of base substrate wafer 40, lid substrate wafer 50, rivet member 9, receiving mold A1, and pressurizing mold A2 used in the manufacturing method will be given.

Figure 8:
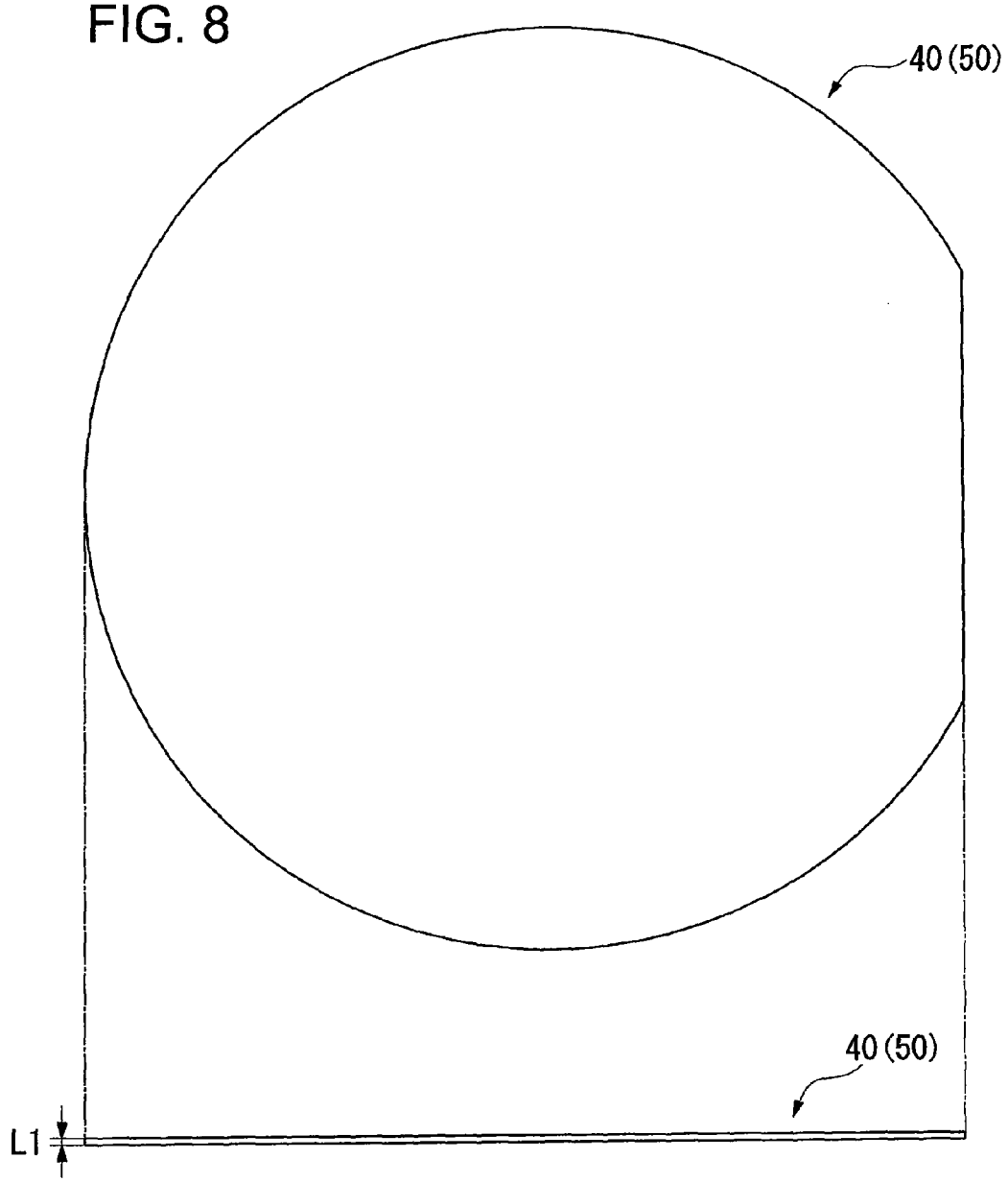
FIG. 8 is a top view and a side view of a base substrate wafer used in a piezoelectric vibrator manufacturing method according to the present invention.

The base substrate wafer 40 and the lid substrate wafer 50 are D-shaped wafers in top view in which a part of the peripheral portion of a disk is cut out as shown in FIG. 8. The two wafers 40 and 50 can be also formed by polishing a soda-lime glass, for example, to a predetermined thickness, cleaning the polished glass, and then removing the affected uppermost layer by etching or the like. In the present embodiment, the thickness of the polished base substrate wafer 40 is set to L1.

Figure 9:
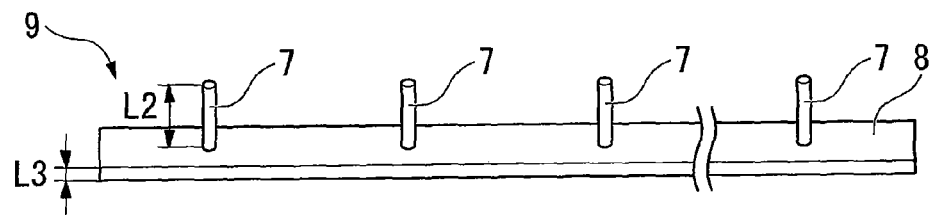
FIG. 9 is a perspective view of a rivet member used in the piezoelectric vibrator manufacturing method according to the present invention.

As shown in FIG. 9, the rivet member 9 is a conductive member which includes a planar base portion 8 and core portions 7 extending from the rear surface of the base portion 8. In the present embodiment, a rivet member in which a plurality of core portions 7 is formed on the same base portion 8 is used as the rivet member 9.

In the illustrated example, the base portion 8 is formed in a rectangular shape in top view, and the respective core portions 7 are provided approximately at the central portion in the short-width direction thereof. Moreover, the length in the longitudinal direction of the base portion 8 and the distance between the core portions 7 along the longitudinal direction are determined so as to correspond to the position of the base substrate wafer 40 on which the rivet member 9 having the base and core portions is disposed in a core portion disposing step described later.

In addition, in the illustrated example, the core portions 7 are formed in a cylindrical shape so as to extend from the base portion 8 in a direction approximately perpendicular to the rear surface of the base portion 8, and the tip ends thereof are formed to be flat. The thickness L2 of the core portions 7 is smaller than the thickness L1 of the base substrate wafer 40. The core portions 7 may be formed in other shapes such as a rectangular column.

Moreover, the rivet member 9 is formed, for example, from kovar, a Dumet wire, and Fe—Ni alloys by machining or the like, and the thermal expansion coefficient thereof is approximately the same as the base substrate wafer 40.

Figure 10:
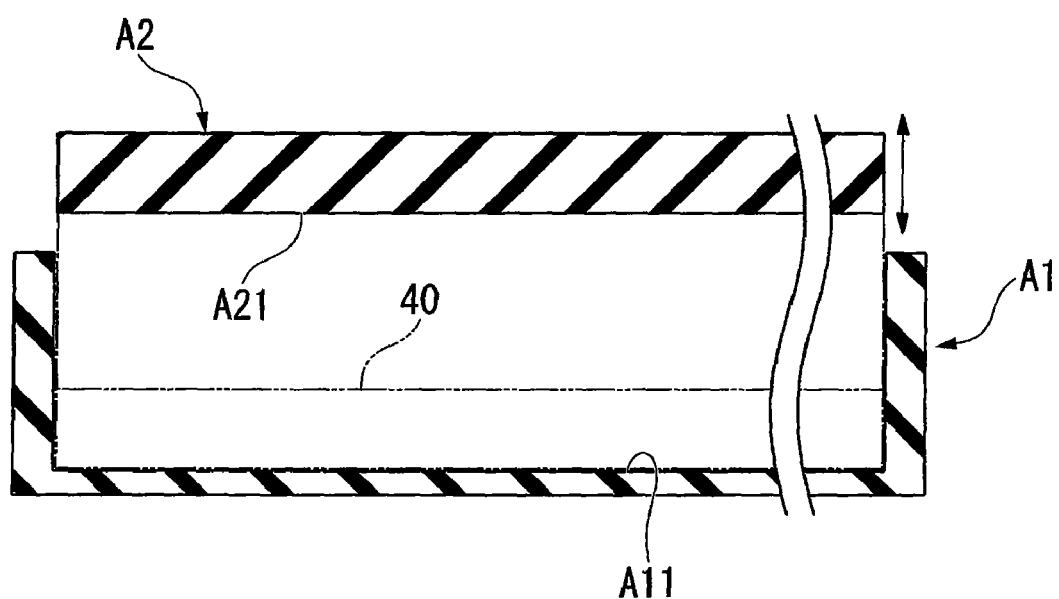
FIG. 10 is a sectional view of a receiving mold and a pressurizing mold used in the piezoelectric vibrator manufacturing method according to the present invention.

As shown in FIG. 10, the receiving mold A1 has a recess portion A11 in which the base substrate wafer 40 can be fitted and received.

The recess portion A11 is formed so that it has approximately the same size as the base substrate wafer 40 in top view, and the inner circumferential surface thereof has a straight shape in sectional view.

The pressurizing mold A2 is a mold that applies pressure by pressing the base substrate wafer 40. In the present embodiment, the pressurizing mold A2 is formed to a size such that it can be fitted and received in the recess portion A11 of the receiving mold A1, and at least one of the surfaces thereof is configured as a flat surface A21. Thus, the pressurizing mold A2 can be fitted and received in the recess portion A11 in a state where the flat surface A21 faces the recess portion A11 of the receiving mold A1. The pressurizing mold A2 is formed, for example, from ceramics and the like.

Next, a method for manufacturing a plurality of the above-described piezoelectric vibrators 1 at a time using the base substrate wafer 40, lid substrate wafer 50, rivet member 9, receiving mold A1, and pressurizing mold A2 will be described with reference to the flowchart shown in FIG. 11.

First, in a piezoelectric vibrating reed manufacturing step, the piezoelectric vibrating reed 4 shown in FIGS. 5 to 7 is manufactured (S10). Specifically, first, a rough quartz crystal Lambert is sliced at a predetermined angle to obtain a wafer having a certain thickness. Subsequently, the wafer is subjected to crude processing by lapping, and an affected layer is removed by etching. Then, the wafer is subjected to mirror processing such as polishing to obtain a wafer having a predetermined thickness. Subsequently, the wafer is subjected to appropriate processing such as washing, and the wafer is patterned so as to have the outer shape of the piezoelectric vibrating reed 4 by a photolithography technique. Moreover, a metal film is formed and patterned on the wafer, thus forming the excitation electrode 15, the extraction electrodes 19 and 20, the mount electrodes 16 and 17, and the weight metal film 21. In this way, a plurality of piezoelectric vibrating reeds 4 can be manufactured.

Moreover, after the piezoelectric vibrating reeds 4 are manufactured, rough tuning of a resonance frequency is performed. This rough tuning is achieved by irradiating the rough tuning film 21a of the weight metal film 21 with a laser beam to evaporate a part of the rough tuning film 21a, thus changing the weight thereof. Fine tuning of adjusting the resonance frequency more accurately is performed after a mounting step is performed. This fine tuning will be described later.

Figure 12:
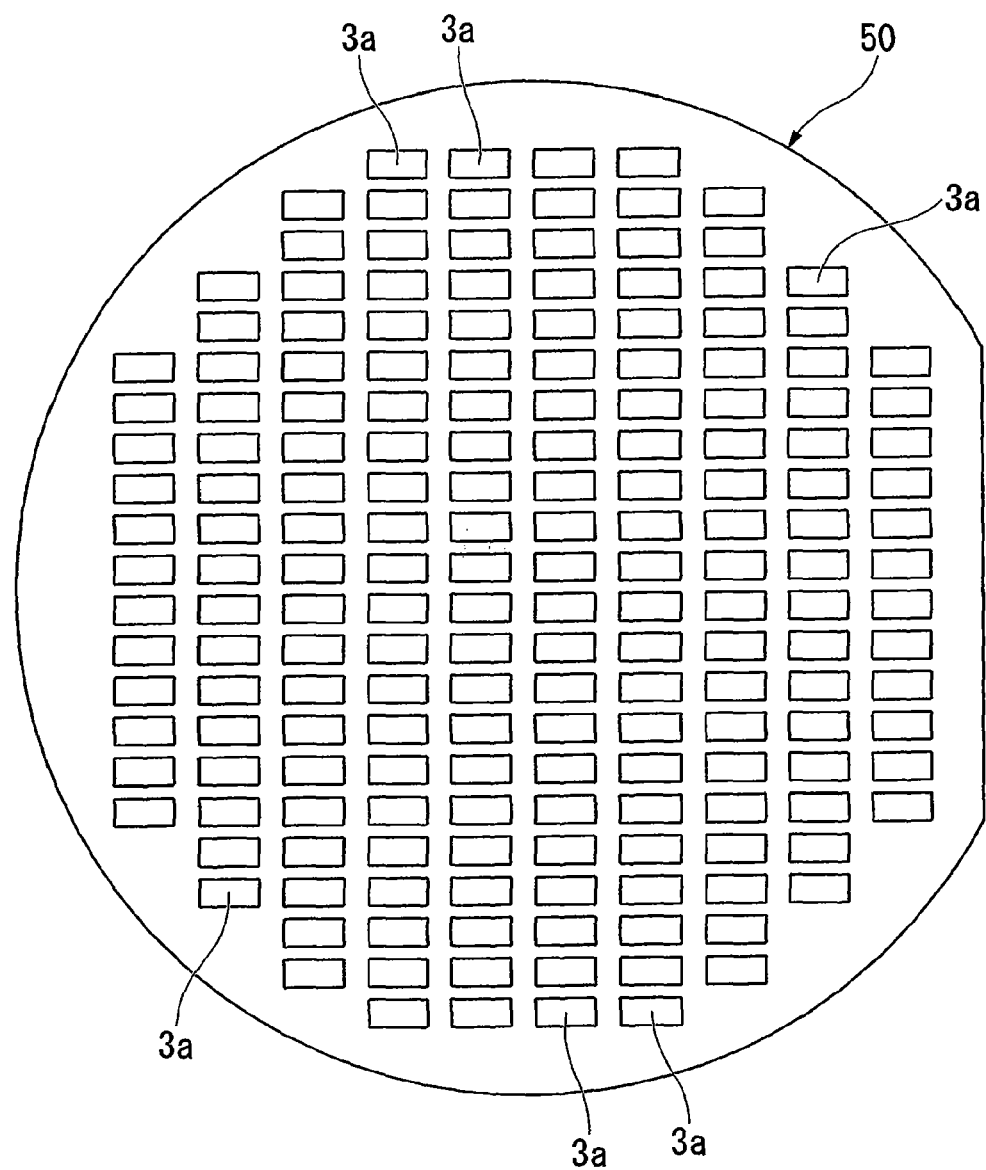
FIG. 12 is a diagram showing one step of the manufacturing process of the piezoelectric vibrator in accordance with the flowchart shown in FIG. 11, showing a state where a plurality of recess portions is formed on a lid substrate wafer serving as a base material of a lid substrate.

Subsequently, in a first wafer manufacturing step, the lid substrate wafer 50 later serving as the lid substrate 3 is manufactured up to a stage immediately before anodic bonding is achieved (S20). First, as described above, the lid substrate wafer 50 formed from a soda-lime glass is formed (S21). After that, in a recess forming step, as shown in FIG. 12, a plurality of recess portions 3a to be used as cavities is formed in a matrix form on the bonding surface of the lid substrate wafer 50 by etching or the like (S22). The first wafer manufacturing step ends at this point in time.

Subsequently, at the same time as the above step or before or after the above step, in a second wafer manufacturing step, a base substrate wafer 40 later serving as the base substrate 2 is manufactured up to a stage immediately before anodic bonding is achieved (S30). First, as described above, a base substrate wafer 40 is formed from a soda-lime glass (S31). After that, in a penetration electrode forming step, a plurality of pairs of penetration electrodes 32 and 33 is formed on the base substrate wafer 40 (S30A). The penetration electrode forming step will be described in detail below.

Figure 13:
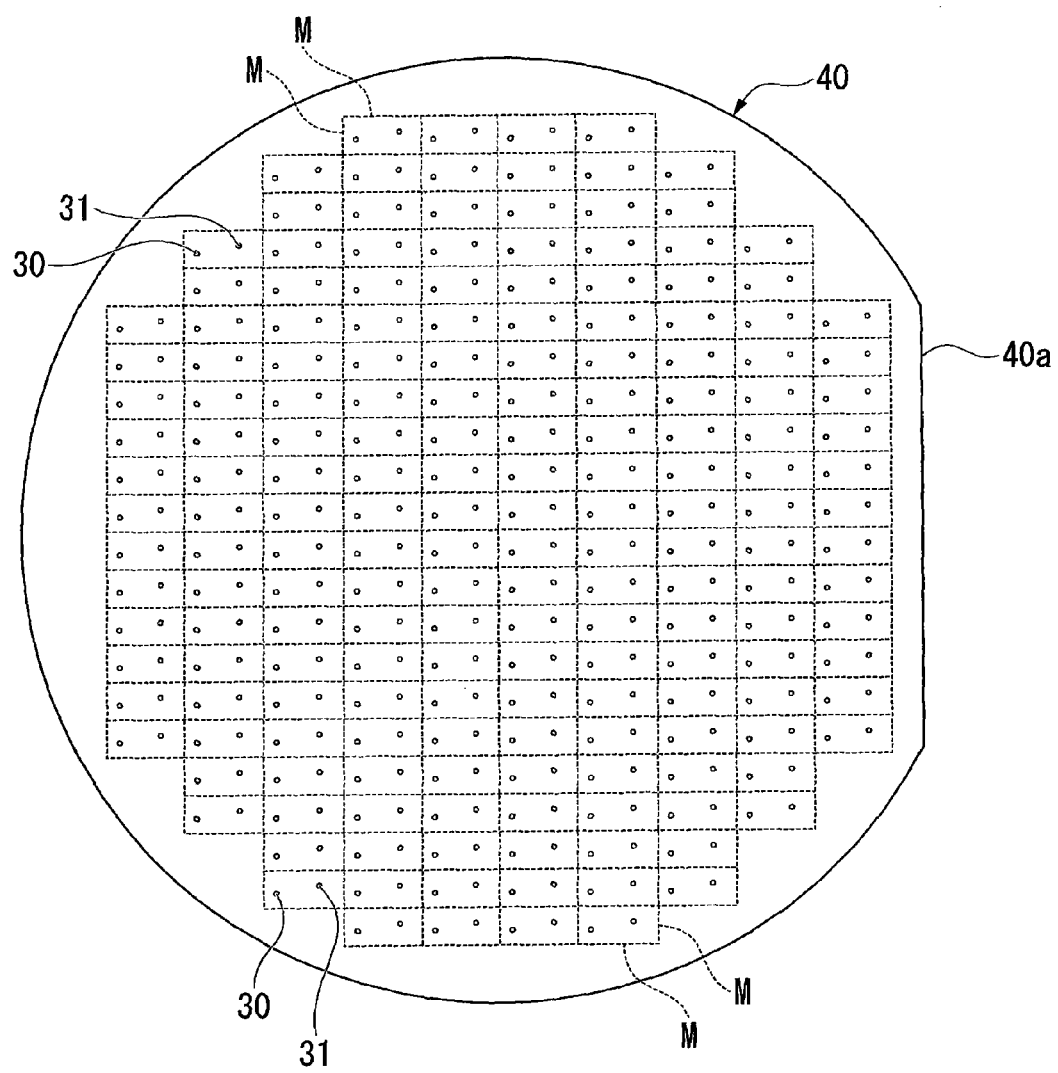
FIG. 13 is a diagram showing one step of the manufacturing process of the piezoelectric vibrator in accordance with the flowchart shown in FIG. 11, showing a state where a pair of through-holes is formed on a base substrate wafer serving as a base material of a base substrate.
Figure 14:
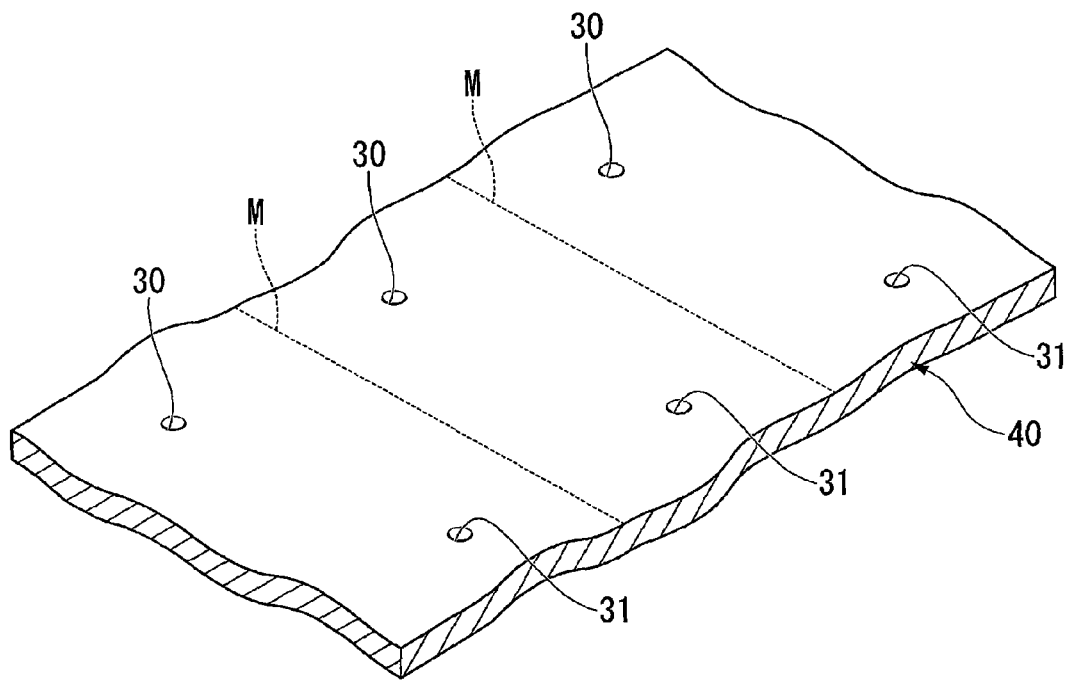
FIG. 14 is a partially enlarged perspective view of the base substrate wafer shown in FIG. 13.
Figure 15:
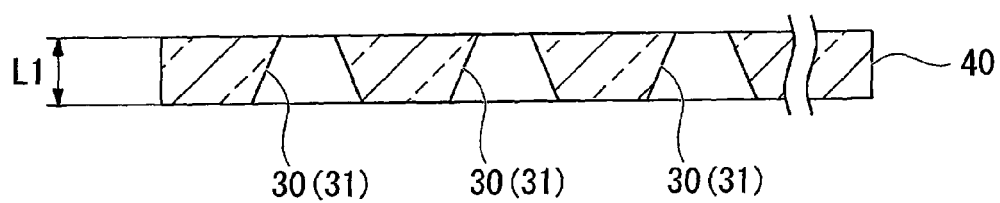
FIG. 15 is a sectional view of the base substrate wafer showing the state shown in FIG. 14.

First, as shown in FIGS. 13 and 14, in a penetration hole forming step, a plurality of pairs of through-holes 30 and 31 is formed so as to penetrate through the base substrate wafer 40 in the vertical direction (S32). In this case, the step is performed, for example, by a sand blast method, a press working, or the like. Moreover, as shown in FIG. 15, the through-holes 30 and 31 are formed so that an opening end on the upper surface side (the other side) is larger than an opening end on the lower surface side (one side), and the inner diameter thereof gradually decreases from the upper surface side towards the lower surface side.

Moreover, a plurality of pairs of through-holes 30 and 31 is formed so as to be received in the recess portions 3a formed on the lid substrate wafer 50 when the two wafers 40 and 50 are superimposed on each other later. In addition, the plurality of pairs of through-holes 30 and 31 is formed so that one through-holes 30 are positioned close to the base portion 12 of the piezoelectric vibrating reed 4, and the other through-holes 31 are positioned close to the tip end side of the vibrating arms 10 and 11. In the present embodiment, as shown in FIGS. 13 and 14, a plurality of one through-holes 30 (a plurality of the other through-holes 31) is formed along a straight portion 40a of the D-shape of the base substrate wafer 40 so that individual adjacent ones are spaced at equal distances.

The dotted line M shown in FIGS. 13 and 14 is a cutting line along which a cutting step performed later is achieved. Moreover, in FIG. 15 and the sectional views of the base substrate wafer 40 shown below, for better illustration of the drawings, the distance between the through-holes 30 and the circumferential surface of the base substrate wafer 40 and the distance between the adjacent through-holes 30 are schematically illustrated.

Figure 16:
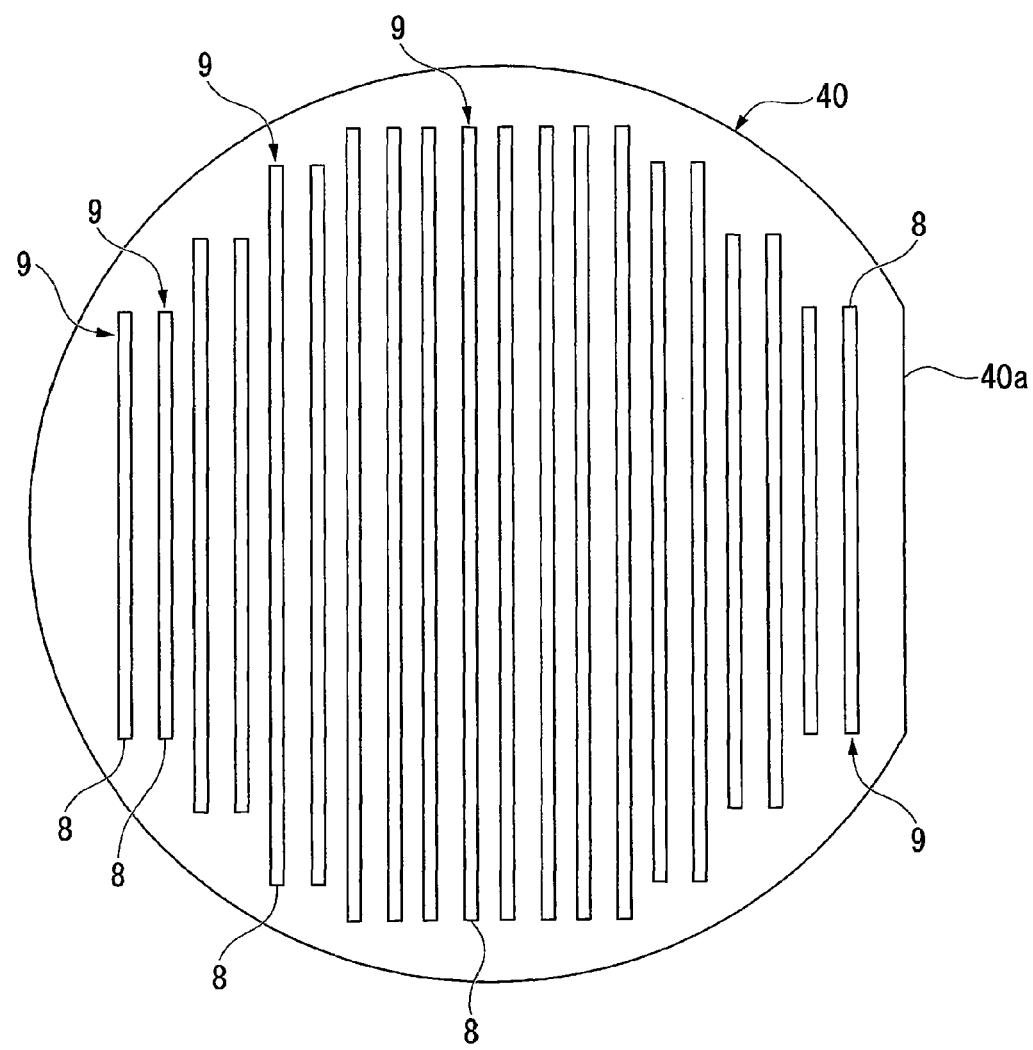
FIG. 16 is a diagram showing one step of the manufacturing process of the piezoelectric vibrator in accordance with the flowchart shown in FIG. 11, showing a state where core portions of a rivet member are inserted into through-holes, subsequent to the state shown in FIG. 13.
Figure 17:
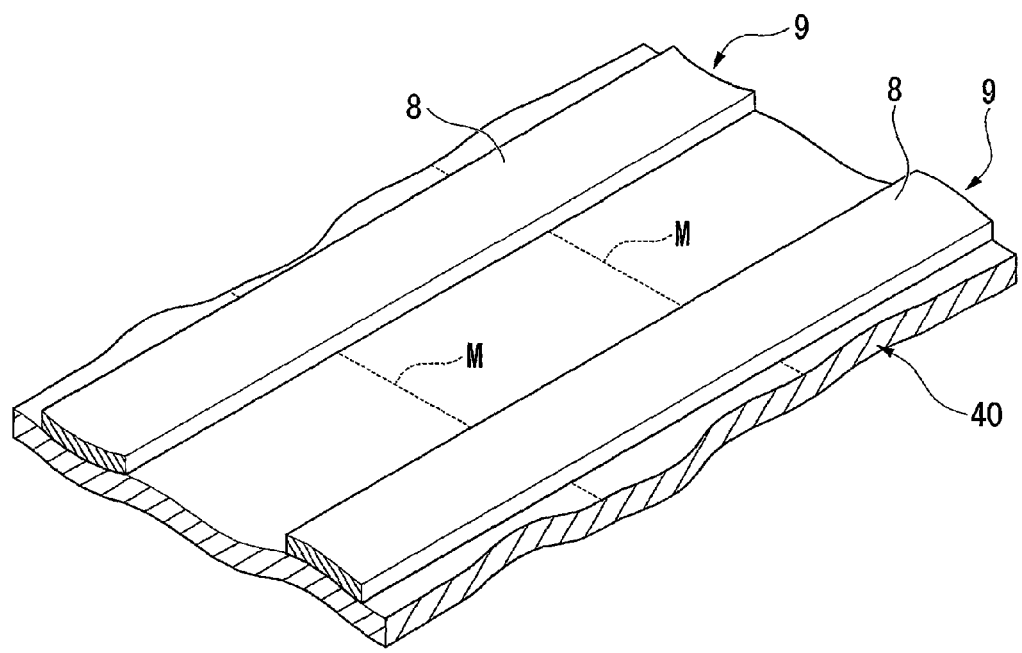
FIG. 17 is a partially enlarged perspective view of the base substrate wafer shown in FIG. 16.
Figure 18:
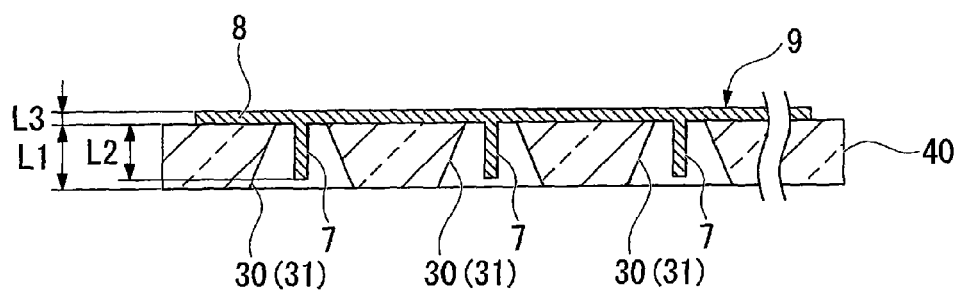
FIG. 18 is a sectional view of the base substrate wafer showing the state shown in FIG. 17.

Subsequently, as shown in FIGS. 16 to 18, in a core portion insertion step, the core portions 7 of the rivet member 9 are inserted into the individual ones of the plurality of through-holes 30 and 31 from the upper surface side of the base substrate wafer 40 (S33). At that time, since the thickness L2 of the core portions 7 is smaller than the thickness L1 of the base substrate wafer 40, the tip ends of the core portions 7 are disposed inside the through-holes 30 and 31.

Moreover, in the illustrated example, different rivet members 9 are used for each row of the through-holes 30 and 31 arranged along the straight portion 40a, and the core portions 7 of each of the rivet members 9 are inserted into the through-holes 30 and 31. Therefore, the base portions 8 of the rivet members 9 are formed to a length such that the length in the longitudinal direction thereof can cover the entirety of the through-holes 30 and 31 arranged along the straight portion 40a at the position of the base substrate wafer 40 on which the rivet members 9 are disposed. Moreover, the spacing of the core portions 7 formed on the base portion 8 of each of the rivet members 9 are formed so as to be the same as the distance between the through-holes 30 and 31 adjacent along the straight portion 40a.

Subsequently, prior to a description of a melting step, a description of a fixing jig B used in this step will be provided.

Figure 19:
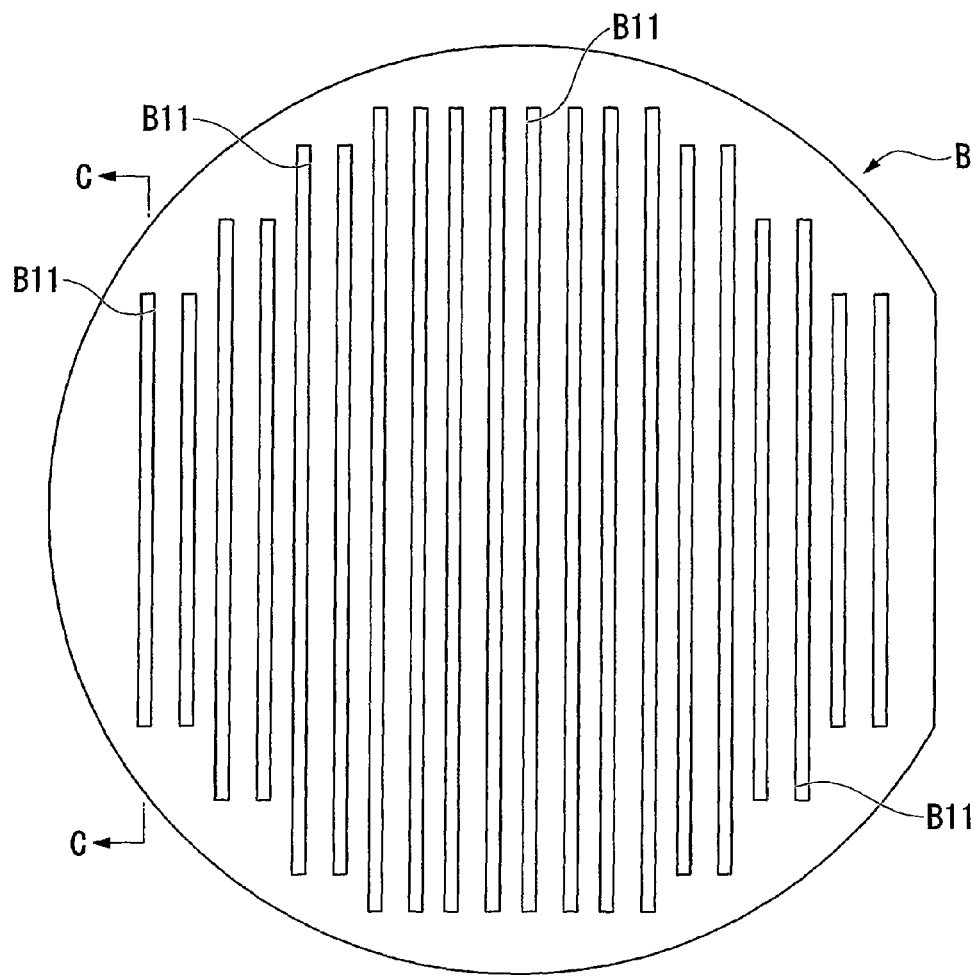
FIG. 19 is a top view of a fixing jig used in the piezoelectric vibrator manufacturing method according to the present invention.
Figure 20:
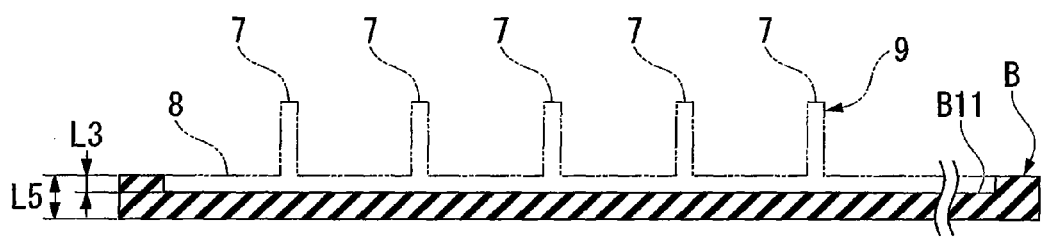
FIG. 20 is a sectional view taken along the arrow C-C in FIG. 19.

As shown in FIGS. 19 and 20, the fixing jig B is configured to form a flat surface together with the rear surfaces of the base portions 8 in a state where the base portions 8 of the rivet members 9 are interposed between the base substrate wafer 40 and the fixing jig B. In the present embodiment, the fixing jig B is a plate of approximately the same size as the base substrate wafer 40 in top view and is formed, for example, from carbon or the like.

Moreover, on the surface of the fixing jig B, a plurality of recess portions B11 in which the base portions 8 of the rivet members 9 are fitted and received is formed. The recess portions B11 are formed approximately the same size as the base portions 8 at positions facing the base portions 8 of the rivet members 9 in a state of being inserted into the base substrate wafer 40, and the depth thereof corresponds to the thickness L3 of the base portion 8 of the rivet member 9. Therefore, when the base portions 8 of the rivet members 9 are fitted and received in the recess portions B11, it is possible to form a flat surface together with the rear surfaces of the base portions 8.

Figure 21:
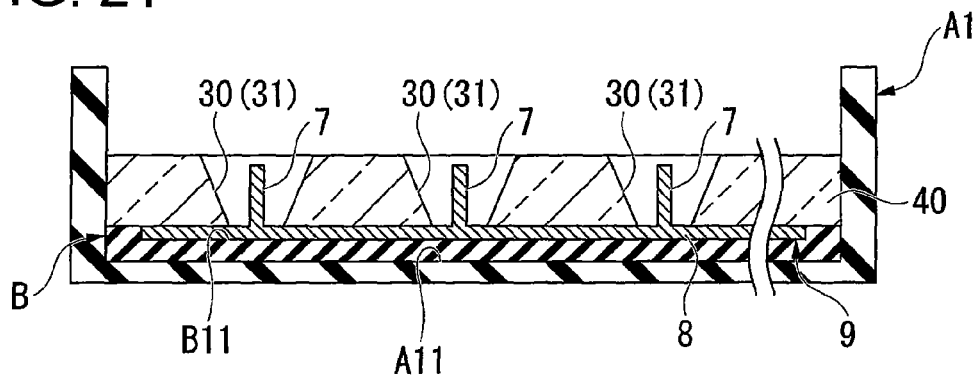
FIG. 21 is a diagram showing one step of the manufacturing process of the piezoelectric vibrator in accordance with the flowchart shown in FIG. 11, showing a state where the base substrate wafer is placed on a receiving mold, subsequent to the state shown in FIG. 18.

Subsequently, in a melting step, the gaps between the inner circumferential walls of the through-holes 30 and 31 and the rivet members 9 are closed (S34). The melting step of the present embodiment will be described in detail. First, in a setting step, as shown in FIG. 21, the base substrate wafer 40 in which the rivet members 9 are inserted is disposed in the recess portion A11 of the receiving mold A1 (S34a). At that time, the base substrate wafer 40 is disposed in a state where the upper surface side thereof faces the receiving mold A1. Further, the fixing jig B is disposed between the base substrate wafer 40 and the receiving mold A1.

In this way, the rear surfaces of the base portions 8 of the rivet members 9 can be brought into contact with the base substrate wafer 40. In addition, since the fixing jig B forms a flat surface together with the rear surfaces of the base portions 8 in a state where the base portions 8 of the rivet members 9 are interposed between the base substrate wafer 40 and the fixing jig B, the entirety of the upper surface of the base substrate wafer 40 is supported by the flat surface.

Subsequently, the receiving mold A1 on which the base substrate wafer 40 is set is disposed in a heating furnace (not shown) of which the internal temperature can be adjusted. At that time, the inside of the heating furnace is heated so that the temperature of the surface portion on the lower surface side of the base substrate wafer 40 is 850 to 1000° C., for example. As the heating furnace, an intermediate-temperature molding furnace capable of adjusting its temperature, for example, using gas, electricity, or the like may be used.

Figure 22:
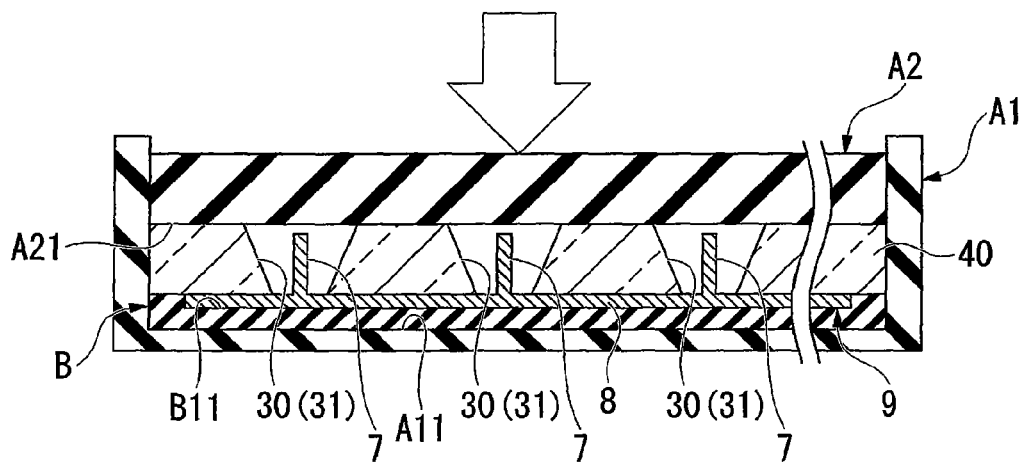
FIG. 22 is a diagram showing one step of the manufacturing process of the piezoelectric vibrator in accordance with the flowchart shown in FIG. 11, showing a state where the base substrate wafer is pressurized by the pressurizing mold, subsequent to the state shown in FIG. 21.

Subsequently, as shown in FIG. 22, in a pressurizing step, the surface portion on the lower surface side of the base substrate wafer 40 disposed in the recess portion A11 of the receiving mold A1 is pressed by the pressurizing mold A2 (S34b). At that time, using a press machine (not shown) or the like disposed in the heating furnace, the base substrate wafer 40 is pressed by the pressurizing mold A2 at a pressure of 30 to 50 g/cm$^2$, for example. As a result, the lower surface side of the base substrate wafer 40 is heated and pressed, whereby the surface portion on the lower surface side of the base substrate wafer 40 is melted to produce a liquid base substrate material 41.

Figure 23:
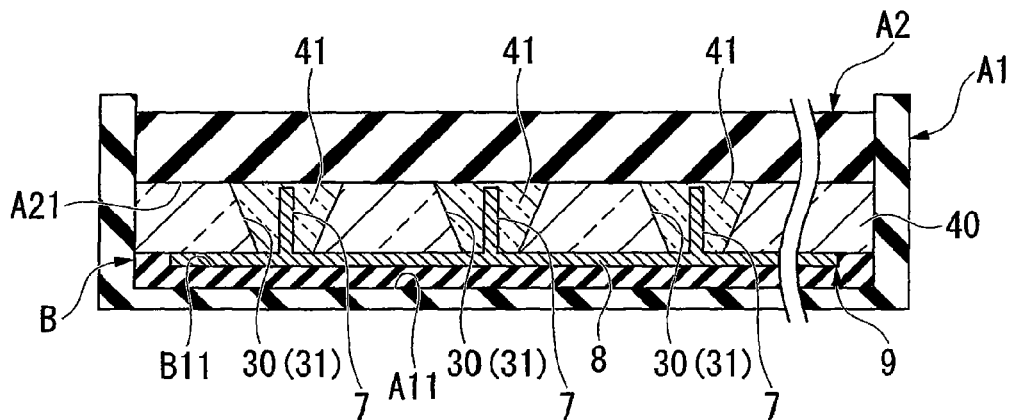
FIG. 23 is a diagram showing one step of the manufacturing process of the piezoelectric vibrator in accordance with the flowchart shown in FIG. 11, showing a state where a base substrate material is poured into the through-holes, subsequent to the state shown in FIG. 22.

As a result, as shown in FIG. 23, the rear surfaces of the base portions 8 of the rivet members 9 can be brought into contact with the base substrate wafer 40 to close the opening end on the upper surface side of the through-holes 30 and 31. Moreover, the base substrate material 41 can be poured into the gaps between the inner circumferential walls of the through-holes 30 and 31 and the rivet members 9 from the lower surface side of the through-holes 30 and 31. In this way, the base substrate material 41 can be laminated on the rear surfaces of the base portions 8 which close the opening end on the upper surface side, and the gaps can be closed. In the illustrated example, the base substrate material 41 is poured so as to close the gaps and cover the tip ends of the core portions 7.

In particular, pressure can be applied just by pressing the surface portion on the lower surface side of the base substrate wafer 40 with the pressurizing mold A2. In addition, since the base substrate wafer 40 is fitted and received in the recess portion A11 of the receiving mold A1, the base substrate wafer 40 will not be misaligned with respect to the pressurizing mold A2 during the pressing with the pressurizing mold A2, and pressure can be applied reliably by pressing the base substrate wafer 40. In this way, the melting step ends.

Subsequently, in a curing step, the base substrate material 41 poured into the gaps is cured (S35). At that time, the receiving mold A1 on which the base substrate wafer 40 is set is taken out of the heating furnace and cooled. In this way, the base substrate wafer 40 and the rivet members 9 can be fixed to be integral with each other.

Particularly, since the base substrate material 41 is cured by cooling, it is possible to suppress a decrease in the volume as compared to a case of burying and baking a paste, prevent the formation of holes in the course of curing, and reliably seal the through-holes 30 and 31. In addition, since the thermal expansion coefficient of the rivet members 9 is approximately the same as the base substrate wafer 40, the rivet members 9 and the base substrate wafer 40 experience similar volume change in the course of cooling. For this reason, no gap will be formed between them, and the through-holes 30 and 31 can be sealed reliably.

In addition, since the upper surface of the base substrate material 41 is cured in a state where it is in contact with the rear surfaces of the base portions 8 of the rivet members 9 being in contact with the base substrate wafer 40, the upper surface can be maintained to be approximately even with the upper surface of the base substrate wafer 40.

Subsequently, the base substrate wafer 40 is removed from the receiving mold A1, and the fixing jig B is removed from the base substrate wafer 40. When the fixing jig B is formed from carbon, since melted glass is rarely attached to carbon, the fixing jig B can be easily removed from the base substrate wafer 40. Moreover, this series of removal operations may be performed after the melting step and prior to a subsequent polishing step, and may be performed prior to the curing step, for example.

Figure 24:
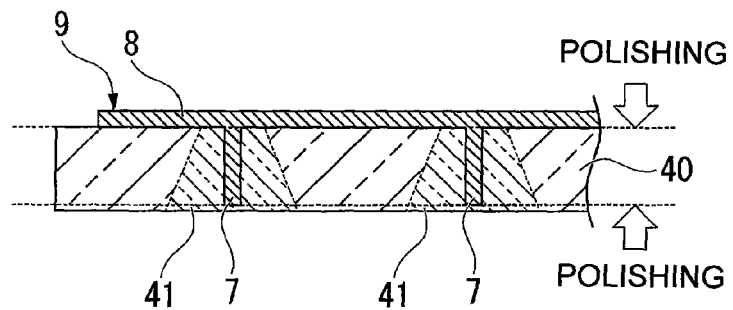
FIG. 24 is a diagram showing one step of the manufacturing process of the piezoelectric vibrator in accordance with the flowchart shown in FIG. 11, showing a state where the base portions of the rivet member are polished, subsequent to the state shown in FIG. 23.

Subsequently, as shown in FIG. 24, in a polishing step, the base substrate wafer 40 and the rivet members 9 are polished (S36). At this time, the base portions 8 of the rivet members 9 are removed, and the base substrate wafer 40 and the core portions 7 are polished to be flat. The polishing step of the present embodiment includes a first polishing step where the base portions 8 are removed from the upper surface side of the base substrate wafer 40 and a second polishing step where the base substrate material 41 which is cured after being poured so as to cover the tip ends of the core portions 7 is polished on the lower surface side of the base substrate wafer 40 so as to expose the tip ends of the core portions 7. As a result, the core portions 7 serve as the penetration electrodes 32 and 33.

Although the base substrate wafer 40 and the base substrate material 41 are illustrated to be distinguished in FIG. 24 for the sake of explanation, since the base substrate material 41 is cured to be integral with the base substrate wafer 40 through the curing step, in fact, they cannot be clearly distinguished as illustrated in the figure.

Particularly, the penetration electrodes 32 and 33 are formed by the conductive core portions 7, and stable conduction can be secured.

In addition, since the base substrate material 41 is cured in a state of being approximately even with the upper surface of the base substrate wafer 40 when the base substrate material 41 is cured during the curing step, it is possible to form the flat surface just by grinding the base portions 8 in the first polishing step without polishing the surface of the base substrate wafer 40. As a result, the efficiency of the polishing step can be improved.

If the base substrate material 41 is not cured in a state of covering the tip ends of the core portions 7, and the surfaces of the core portions 7 are exposed in a state of being even with the base substrate wafer 40, the second polishing step may be not performed. In this way, the penetration electrode forming step ends.

Figure 25:
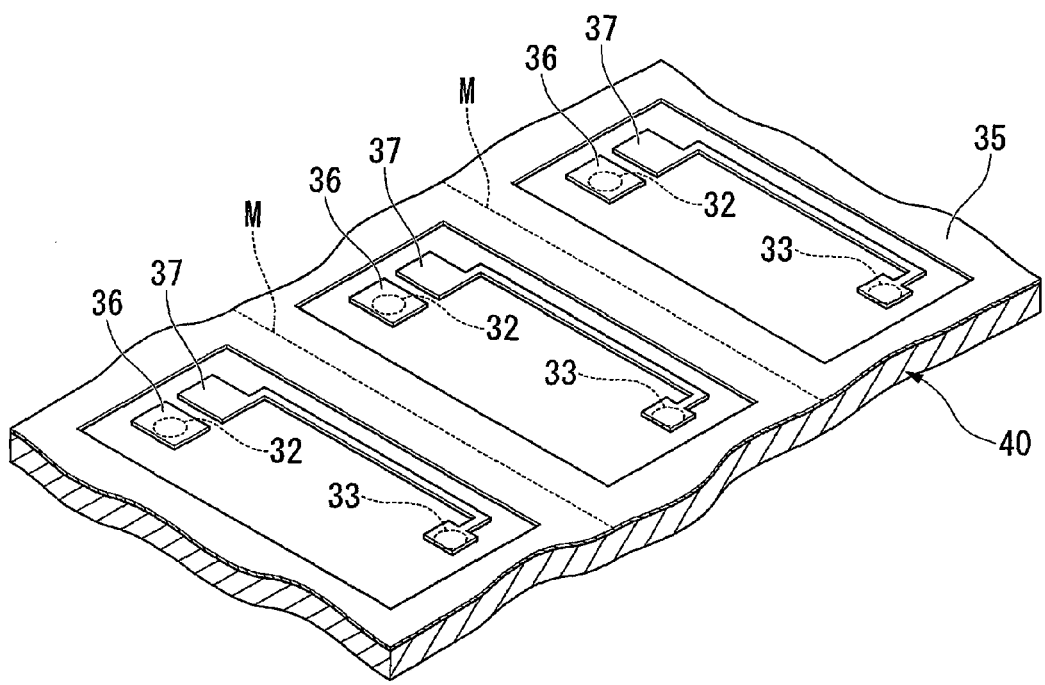
FIG. 25 is a diagram showing one step of the manufacturing process of the piezoelectric vibrator in accordance with the flowchart shown in FIG. 11, showing a state where a bonding film and lead-out electrodes are patterned onto the upper surface of the base substrate wafer, subsequent to the state shown in FIG. 23.
Figure 26:
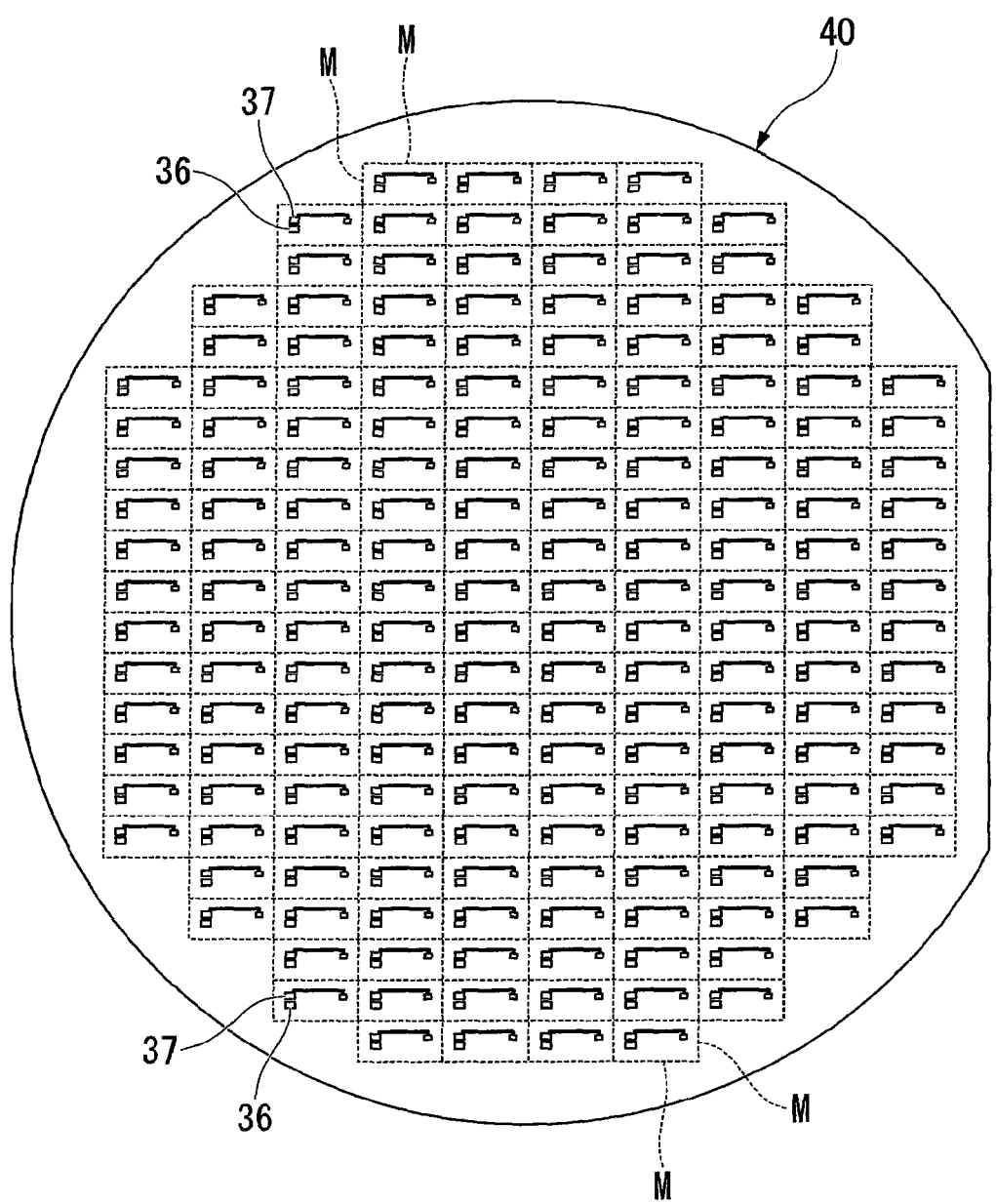
FIG. 26 is an overall view of the base substrate wafer in the state shown in FIG. 24.

Subsequently, in a bonding film forming step, a conductive material is patterned on the upper surface of the base substrate wafer 40 so as to form a bonding film 35 as shown in FIGS. 25 and 26 (S37). Moreover, in a lead-out electrode forming step, a plurality of lead-out electrodes 36 and 37 is formed so as to be electrically connected to each pair of the penetration electrodes 32 and 33, respectively (S38). The dotted line M shown in FIGS. 25 and 26 is a cutting line along which a cutting step performed later is achieved. The second wafer manufacturing step ends at this point in time.

Figure 11:
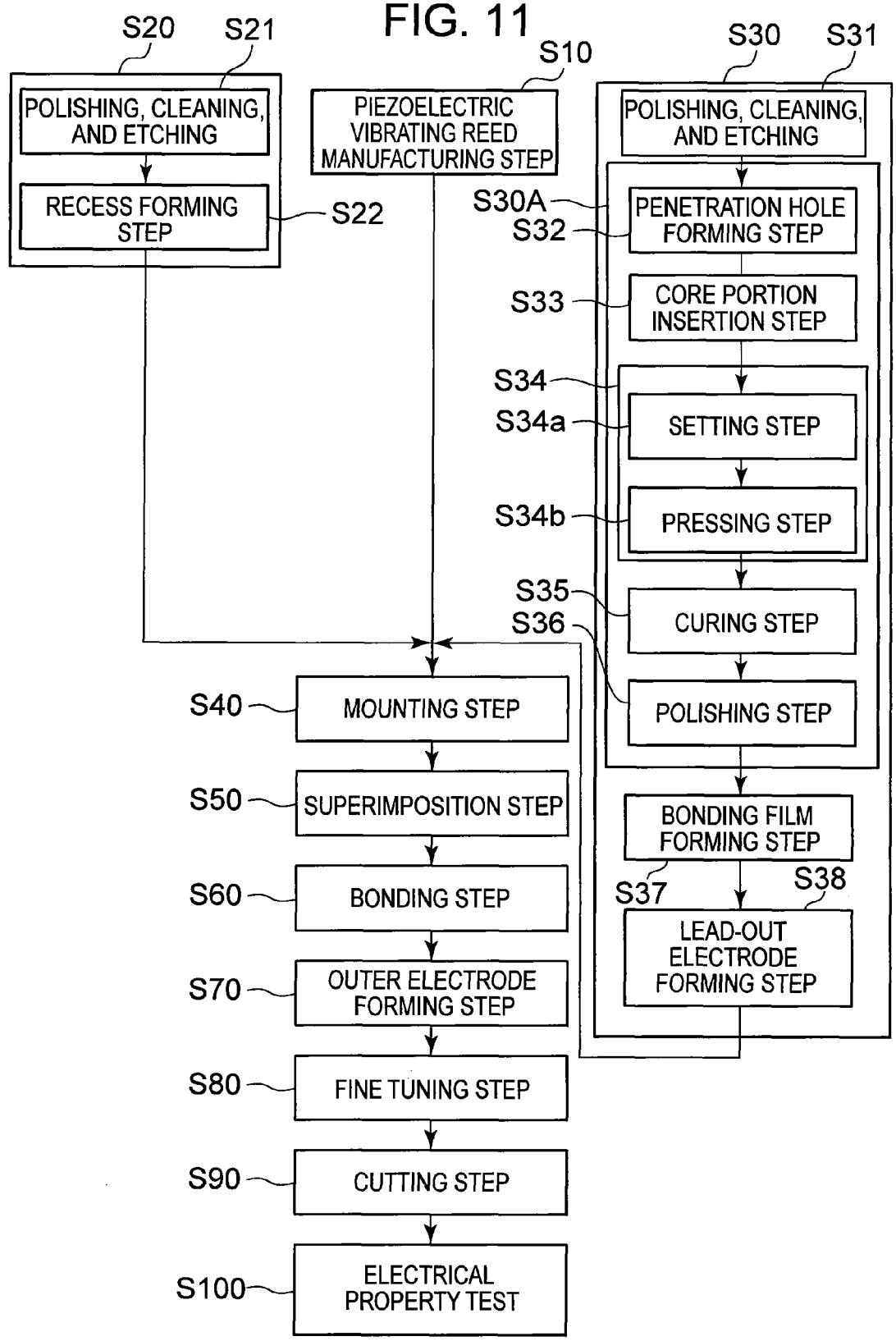
FIG. 11 is a flowchart showing the flow of the manufacturing process of the piezoelectric vibrator shown in FIG. 1.

In FIG. 11, although the lead-out electrode forming step (S38) is performed after the bonding film forming step (S37), conversely, the bonding film forming step (S37) may be performed after the lead-out electrode forming step (S38), and the two steps may be performed at the same time. The same operational effect can be obtained with any order of the steps. Therefore, the order of the steps may be appropriately changed according to the needs.

Subsequently, in a mounting step, a plurality of manufactured piezoelectric vibrating reeds 4 is bonded to the upper surface of the base substrate wafer 40 via the lead-out electrodes 36 and 37 (S40). First, bumps P made from gold or the like are formed on the pair of lead-out electrodes 36 and 37. The base portion 12 of the piezoelectric vibrating reed 4 is placed on the bumps P, and thereafter, the piezoelectric vibrating reed 4 is pressed against the bumps P while heating the bumps P to a predetermined temperature (for example, 300° C.). In this way, the piezoelectric vibrating reed 4 is mechanically supported by the bumps P, and the mount electrodes 16 and 17 are electrically connected to the lead-out electrodes 36 and 37. Therefore, at this point in time, the pair of excitation electrodes 15 of the piezoelectric vibrating reed 4 is electrically connected to the pair of penetration electrodes 32 and 33, respectively.

Particularly, since the piezoelectric vibrating reed 4 is bump-bonded, the piezoelectric vibrating reed 4 is supported in a state of being floated from the upper surface of the base substrate wafer 40.

After the piezoelectric vibrating reed 4 is mounted, in a superimposition step, the lid substrate wafer 50 is superimposed on the base substrate wafer 40 (S50). Specifically, both wafers 40 and 50 are aligned at a correct position using reference marks or the like not shown in the figure as indices. In this way, the mounted piezoelectric vibrating reed 4 is accommodated in the cavity C which is surrounded by the recess portion 3a formed on the lid substrate wafer 40 and the two wafers 40 and 50.

Figure 27:
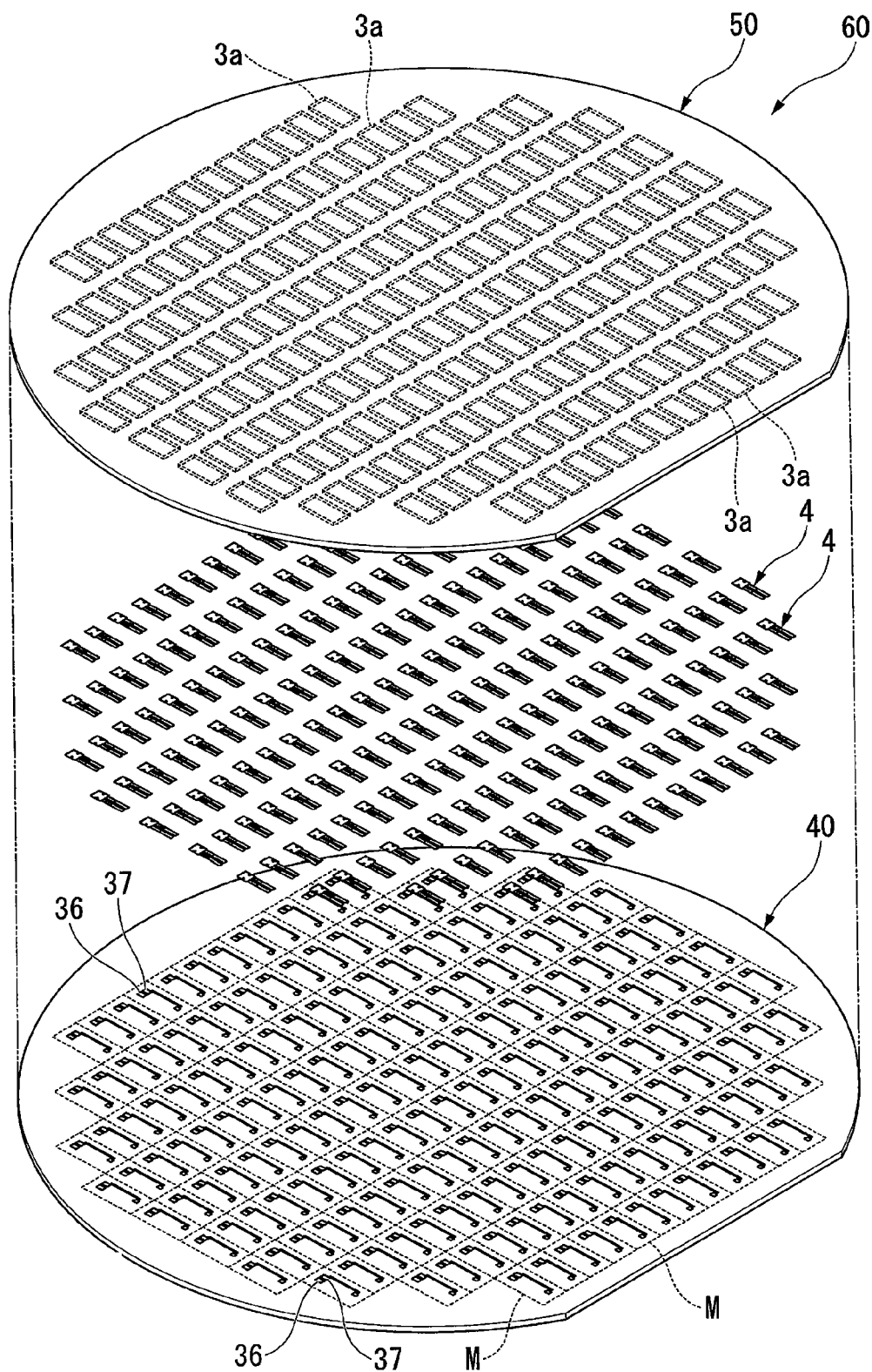
FIG. 27 is an exploded perspective view showing one step of the manufacturing process of the piezoelectric vibrator in accordance with the flowchart shown in FIG. 11, showing a wafer assembly in which the base substrate wafer and the lid substrate wafer are anodically bonded with the piezoelectric vibrating reed accommodated in the cavity.

After the superimposition step is performed, in a bonding step, the two superimposed wafers 40 and 50 are inserted into an anodic bonding machine (not shown) to achieve anodic bonding under a predetermined temperature atmosphere with application of a predetermined voltage (S60). Specifically, a predetermined voltage is applied between the bonding film 35 and the lid substrate wafer 50. Then, an electrochemical reaction occurs at an interface between the bonding film 35 and the lid substrate wafer 50, whereby they are tightly adhered and anodically bonded. In this way, the piezoelectric vibrating reed 4 can be sealed in the cavity C, and a wafer assembly 60 shown in FIG. 27 can be obtained in which the base substrate wafer 40 and the lid substrate wafer 50 are bonded to each other. In FIG. 27, for better understanding of the figure, the wafer assembly 60 is illustrated in an exploded state, and an illustration of the bonding film 35 is omitted from the base substrate wafer 40. The dotted line M shown in FIG. 27 is a cutting line along which a cutting step performed later is achieved.

After the above-described anodic bonding is completed, in an outer electrode forming step, a conductive material is patterned onto the lower surface of the base substrate wafer 40 so as to form a plurality of pairs of outer electrodes 38 and 39 which is respectively electrically connected to the pair of penetration electrodes 32 and 33 (S70). By this step, the piezoelectric vibrating reed 4 which is sealed in the cavity C can be operated using the outer electrodes 38 and 39.

Subsequently, in a fine tuning step, the frequencies of the individual piezoelectric vibrators 1 sealed in the cavities C in the state of being formed as the wafer assembly 60 are tuned finely to fall within a predetermined range (S80). Specifically, a voltage is applied to the pair of outer electrodes 38 and 39 which are formed on the lower surface of the base substrate wafer 40, thus allowing the piezoelectric vibrating reeds 4 to vibrate. A laser beam is irradiated onto the lid substrate wafer 50 from the outer side while measuring the vibration frequencies to evaporate the fine tuning film 21b of the weight metal film 21. In this way, since the weight on the tip end sides of the pair of vibrating arms 10 and 11 is changed, the fine tuning can be performed in such a way that the frequency of the piezoelectric vibrating reed 4 falls within the predetermined range of the nominal frequency.

After the fine tuning of the frequency is completed, in a cutting step, the bonded wafer assembly 60 is cut along the cutting line M shown in FIG. 27 to obtain small fragments (S90). As a result, a plurality of two-layered surface mount device-type piezoelectric vibrators 1 shown in FIG. 1, in which the piezoelectric vibrating reed 4 is sealed in the cavity C formed between the base substrate 2 and the lid substrate 3 being bonded together, can be manufactured at the same time.

The fine tuning step (S80) may be performed after performing the cutting step (S90) to obtain the individual small fragments of the piezoelectric vibrators 1. However, as described above, by performing the fine tuning step (S80) earlier, since the fine tuning step can be performed on the wafer assembly 60, it is possible to perform the fine tuning on the plurality of piezoelectric vibrators 1 more efficiently. Therefore, it is desirable because throughput can be improved.

Subsequently, an internal electrical property test of the piezoelectric vibrating reed 4 is conducted (S100). That is, the resonance frequency, resonance resistance value, drive level properties (the excitation power dependence of the resonance frequency and the resonance resistance value), and the like of the piezoelectric vibrating reed 4 are measured and checked. Moreover, the insulation resistance value properties and the like are checked as well. Finally, an external appearance test of the piezoelectric vibrator 1 is conducted to check the dimensions, the quality, and the like. In this way, the manufacturing of the piezoelectric vibrator 1 ends.

Particularly, since the base substrate wafer 40 and the penetration electrodes 32 and 33 are flat, the lead-out electrodes 32 and 33 and the outer electrodes 38 and 39 can be formed in a state of being closely adhered to the penetration electrodes 32 and 33. As a result, it is possible to secure stable conduction between the piezoelectric vibrating reed 4 and the outer electrodes 38 and 39 and improve the reliability of an operation performance and achieve a high quality. In addition, since the penetration electrodes 32 and 33 are configured using the conductive core portions 7, extremely stable conduction can be obtained.

Moreover, since the formation of holes in the base substrate wafer 40 in the course of sealing the through-holes 30 and 31 is prevented, it is possible to prevent degradation of the airtightness of the inside of the cavity C. In this respect, it is possible to achieve a high quality.

In addition, when pressure is applied to the lower surface side of the base substrate wafer 40 by the pressurizing mold A2 in the pressing step, since the entirety of the upper surface of the base substrate wafer 40 is supported by the flat surface formed by the fixing jig B and the base portions 8, the pressure applied to the lower surface side is distributed to act on the upper surface and thus will not be concentrated at a local position. For this reason, it is possible to suppress the formation of cracks or the like in the base substrate wafer 40. In this respect, it is possible to achieve a high quality.

Moreover, since a rivet member in which a plurality of core portions 7 is formed on the same base portion 8 is used as the rivet member 9, the plurality of core portions 7 can be inserted into the through-holes 30 and 31 just by positioning the base portion 8 used in common for the plurality of core portions 7 with respect to the base substrate wafer 40. Therefore, it is not necessary to position the core portions 7 one by one, and it is possible to improve the workability of the core portion insertion step. Moreover, since the core portions 7 extend from the rear surface of the base portion 8, when the core portions 7 are inserted into the through-holes 30 and 31, the rear surface of the base portion 8 comes into contact with the upper surface of the base substrate wafer 40, and the rivet members 9 are caught at the through-holes 30 and 31. By using the rivet members 9, the core portions 7 can be disposed in the through-holes 30 and 31 by such a simple operation. In this respect, it is possible to improve the workability.

Next, a modification of the piezoelectric vibrator manufacturing method according to the above-described embodiment will be described with reference to FIGS. 28 and 29. In this modification, the same steps and constituent elements as those in the above-described embodiment will be denoted by the same reference numerals, and description thereof will be omitted and only the points of difference will be described.

Figure 28:
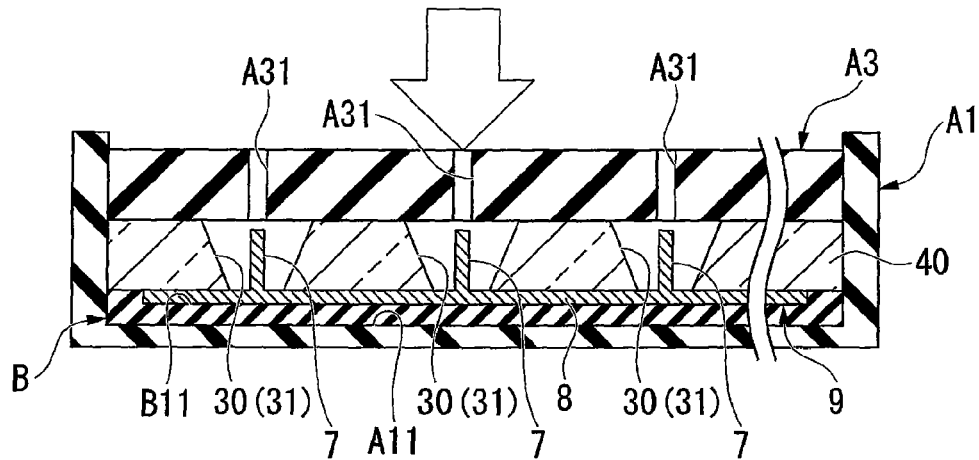
FIG. 28 is a diagram showing a state where the base substrate wafer is pressurized by the pressurizing mold according to a modification of the embodiment of the present invention.
Figure 29:
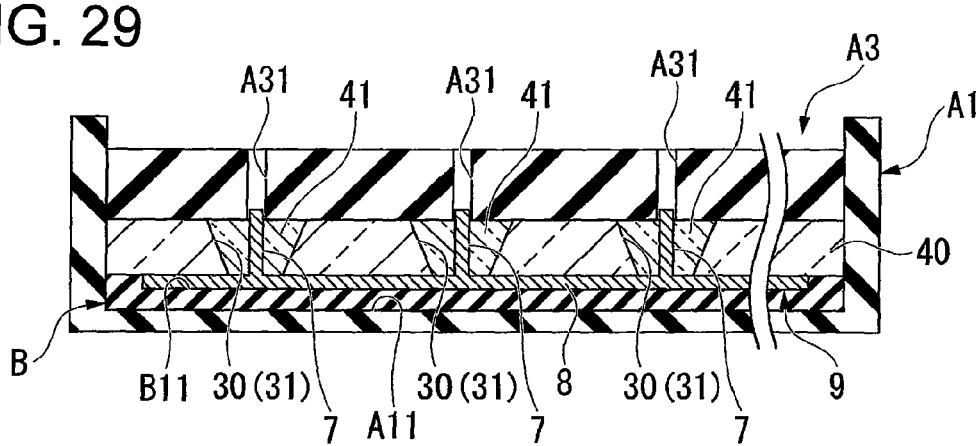
FIG. 29 is a diagram showing a state where the base substrate material is poured into the through-holes, subsequent to the state shown in FIG. 28.

In this modification, as shown in FIG. 28, a pressurizing mold in which core portion insertion holes A31 having approximately the same inner diameter as the outer diameter of the core portions are formed at positions facing the core portions 7 of the rivet member 9 during the pressing step is used as a pressurizing mold A3. In the illustrated example, the core portion insertion holes A31 are formed so as to penetrate through the pressurizing mold A3 along the extending direction of the core portions 7 from the base portion 8.

According to the piezoelectric vibrator manufacturing method according to this modification, the same operational effect as that of the manufacturing method according to the above-described embodiment can be obtained. In addition, in this case, since a structure having the core portion insertion holes A31 is used as the pressurizing mold A3, even when the thickness of the core portions 7 is larger than the thickness of the base substrate wafer 40, the tip ends of the core portions 7 will be inserted through the core portion insertion holes A31 as shown in FIG. 29 and will not come into contact with the pressurizing mold A3 in the course of pressing the base substrate wafer 40 with the pressurizing mold A3 during the pressing step. Therefore, regardless of the thickness of the core portions 7, the base substrate wafer 40 can be pressed by the pressurizing mold A3 so as to be melted until the surface on the lower surface side of the base substrate wafer 40 becomes flat.

Moreover, in this case, in the polishing step, on the lower surface side of the base substrate wafer 40, the base substrate wafer 40 and the core portions 7 can be polished to be flat by grinding the core portions 7 protruding from the base substrate wafer 40.

By using the pressurizing mold A3 illustrated in this modification, even when the rivet member 9 of which the core portions 7 have the thickness L2 larger than the thickness L1 of the base substrate wafer 40 is used, the above-described pressing step can be performed.

Next, an oscillator according to an embodiment of the present invention will be described with reference to FIG. 30.

Figure 30:
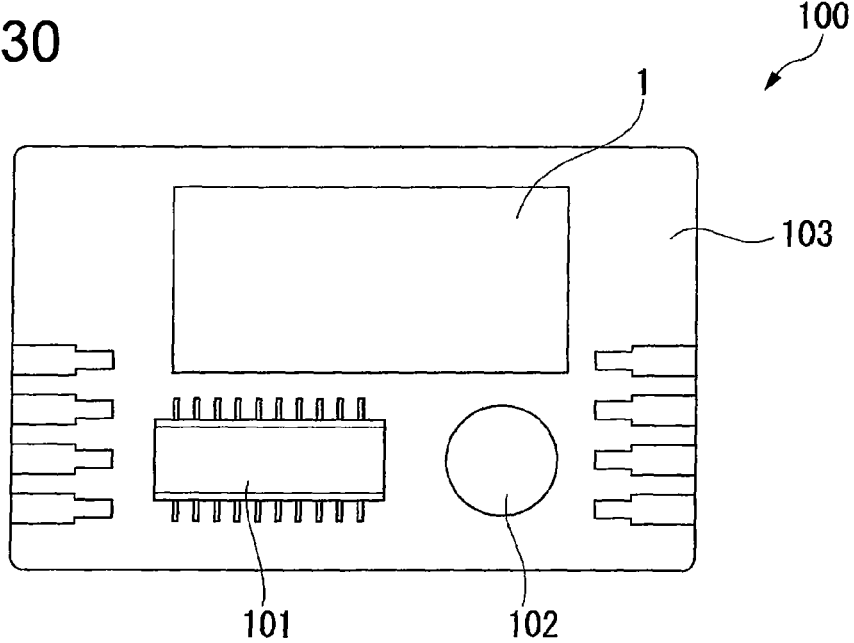
FIG. 30 is a diagram showing the configuration of an oscillator according to an embodiment of the present invention.

As shown in FIG. 30, an oscillator 100 of the present embodiment is one in which the piezoelectric vibrator 1 is configured as an oscillating piece that is electrically connected to an integrated circuit 101. The oscillator 100 includes a substrate 103 on which an electronic component 102 such as a capacitor is mounted. The integrated circuit 101 for the oscillator is mounted on the substrate 103, and the piezoelectric vibrator 1 is mounted in the vicinity of the integrated circuit 101. The electronic component 102, integrated circuit 101, and piezoelectric vibrator 1 are electrically connected by a wiring pattern which is not shown. It should be noted that the respective components are molded by resin which is not shown.

In the oscillator 100 configured in this manner, the piezoelectric vibrating reed 4 in the piezoelectric vibrator 1 vibrates when a voltage is applied to the piezoelectric vibrator 1. This vibration is converted to an electrical signal by the piezoelectric properties of the piezoelectric vibrating reed 4 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece.

By selectively setting the configuration of the integrated circuit 101, for example, an RTC (Real Time Clock) module, according to the demand, it is possible to add a function of controlling the date or time for operating the device or an external device or providing the time, calendar or the like other than a single-function oscillator for a timepiece and the like.

According to the oscillator 100 of the present embodiment, since the oscillator includes the high-quality piezoelectric vibrator 1 described above, it is possible to achieve an improvement in the quality of the oscillator 100 itself. In addition to this, it is possible to obtain a highly accurate frequency signal which is stable over a long period of time.

Figure 31:
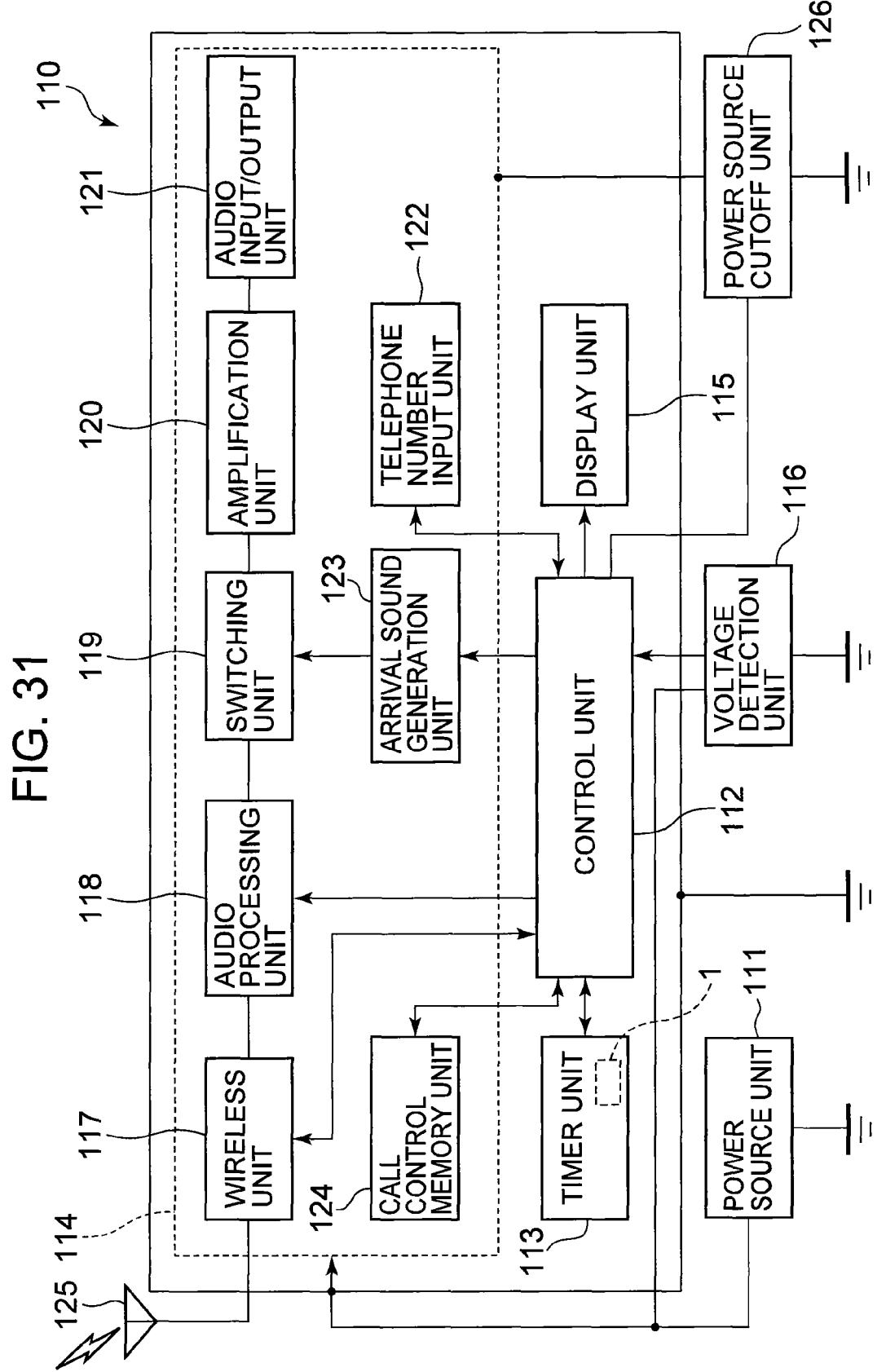
FIG. 31 is a diagram showing the configuration of an electronic device according to an embodiment of the present invention.

Next, an electronic device according to an embodiment of the present invention will be described with reference to FIG. 31. The present embodiment will be described by way of a portable information device 110 having the above-described piezoelectric vibrator 1 as an example of the electronic device. First, the portable information device 110 of the present embodiment is represented, for example, by a cellular phone and is one that developed and improved a wristwatch of the related art. The portable information device 110 looks like a wristwatch in external appearance and is provided with a liquid crystal display at a portion corresponding to the dial pad and is capable of displaying the current time or the like on the screen. When the portable information device 110 is used as a communication tool, the user removes it from the wrist and communicates as with a cellular phone of the related art using the internal speaker and microphone on the inner side of its strap. However, the portable information device 110 is remarkably small and light compared to the cellular phone of the related art.

Next, the configuration of the portable information device 110 of the present embodiment will be described. As shown in FIG. 31, the portable information device 110 includes the piezoelectric vibrator 1 and a power supply portion 111 for supplying power. The power supply portion 111 is formed, for example, from a secondary lithium battery. The power supply portion 111 is connected in parallel to a control portion 112 that performs various kinds of control, a timer portion 113 that counts the time or the like, a communication portion 114 that makes communications with the outside, a display portion 115 that displays various kinds of information, and a voltage detection portion 116 that detects voltages at the respective function portions. The power supply portion 111 supplies power to the respective functional portions.

The control portion 112 controls the respective function portions so as to control the operation of the overall system, such as operations to transmit and receive audio data and operations to count and display the current time. The control portion 112 includes a ROM in which a program is written in advance, a CPU that reads out and runs the program written to the ROM, a RAM used as a work area of the CPU, and the like.

The timer portion 113 includes an integrated circuit enclosing an oscillation circuit, a register circuit, a counter circuit, and an interface circuit, and the like as well as the piezoelectric vibrator 1. When a voltage is applied to the piezoelectric vibrator 1, the piezoelectric vibrating reed 4 vibrates, and this vibration is converted to an electrical signal by the piezoelectric characteristics of the quartz and is input to the oscillation circuit as the electrical signal. The output of the oscillation circuit is binarized and counted by the register circuit and the counter circuit. Signals are transmitted and received to and from the control portion 112 via the interface circuit, and the current time and the current date or the calendar information or the like are displayed on the display portion 115.

The communication portion 114 is provided with the same functions as those of the cellular phone of the related art, and includes a wireless portion 117, an audio processing portion 118, a switching portion 119, an amplifier portion 120, an audio input/output portion 121, a telephone number input portion 122, a ring tone generation portion 123, and a call control memory portion 124.

The wireless portion 117 carries out transmission and reception of various kinds of data, such as audio data, with the base station via an antenna 125. The audio processing portion 118 encodes and decodes an audio signal input therein from the wireless portion 117 or the amplifier portion 120. The amplifier portion 120 amplifies a signal input therein from the audio processing portion 118 or the audio input/output portion 121 to a predetermined level. The audio input/output portion 121 is formed from a speaker, a microphone, and the like, and makes a ring tone and an incoming audio louder and collects sounds.

The ring tone generation portion 123 generates a ring tone in response to a call from the base station. The switching portion 119 switches the amplifier portion 120 normally connected to the audio processing portion 118 to the ring tone generation portion 123 only when a call arrives, so that the ring tone generated in the ring tone generation portion 123 is output to the audio input/output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number or the like of the party being called by depressing these numeric keys.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, and for example, about 3 V. Upon receipt of a notification of a voltage drop from the voltage detection portion 116, the control portion 112 disables the operation of the wireless portion 117, the audio processing portion 118, the switching portion 119, and the ring tone generation portion 123. In particular, it is essential to stop the operation of the wireless portion 117 that consumes a large amount of power. Furthermore, a message stating that the communication portion 114 has become unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, which may be displayed by putting a cross mark on the telephone icon displayed at the top of the display screen of the display portion 115.

By providing a power shutdown portion 126 capable of selectively shutting down the power supply to portions involved with the function of the communication portion 114, it is possible to stop the function of the communication portion 114 in a more reliable manner.

According to the portable information device 110 of the present embodiment, since the portable information device includes the high-quality piezoelectric vibrator 1 described above, it is possible to achieve an improvement in the quality of the portable information device 110 itself. In addition to this, it is possible to display highly accurate clock information which is stable over a long period of time.

Next, a radio-controlled timepiece according to an embodiment of the present invention will be described with reference to FIG. 32.

Figure 32:
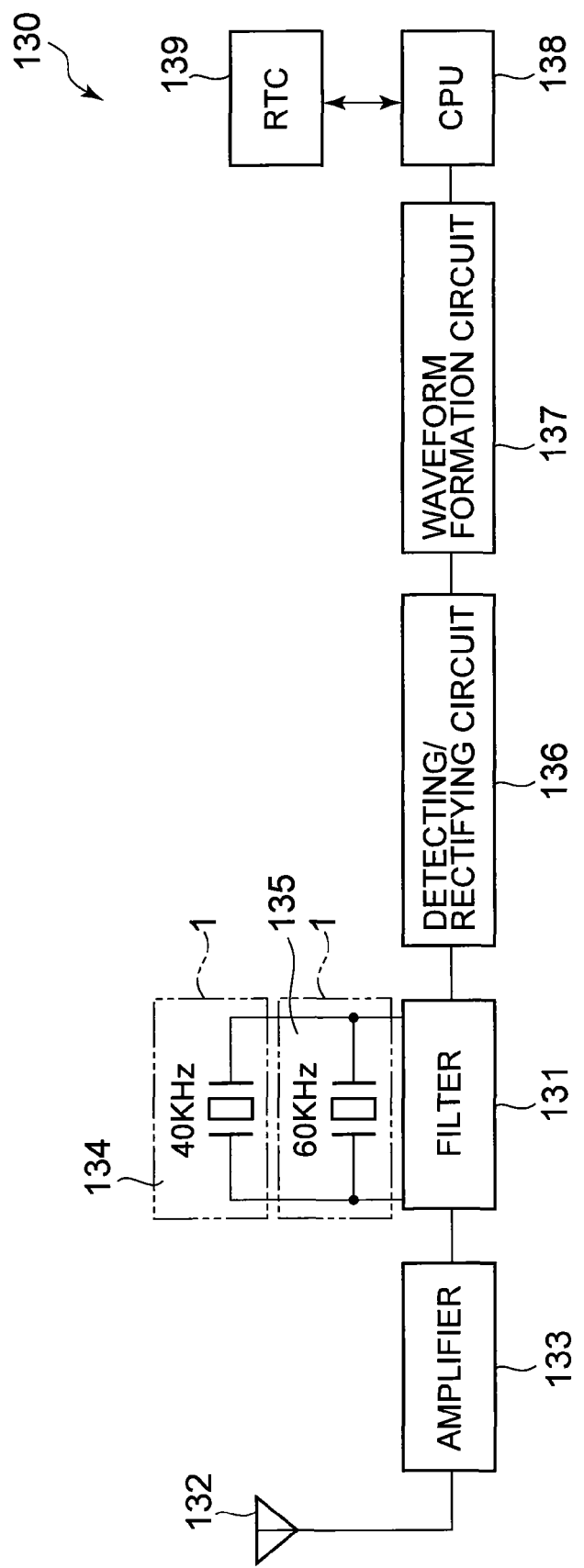
FIG. 32 is a diagram showing the configuration of a radio-controlled timepiece according to an embodiment of the present invention.
Figure 33:
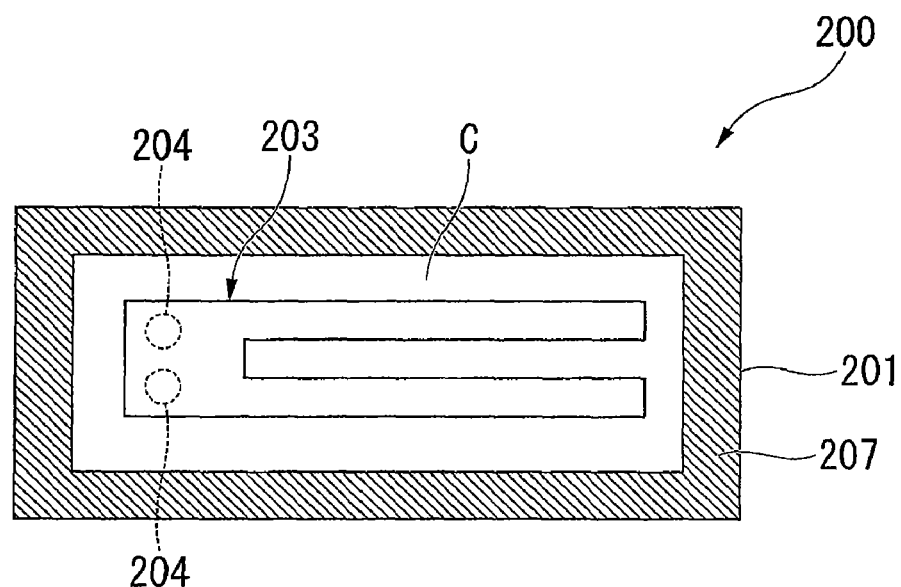
FIG. 33 is a top view showing an inner structure of a piezoelectric vibrator of the related art when a piezoelectric vibrating reed is viewed from above with a lid substrate removed.
Figure 34:
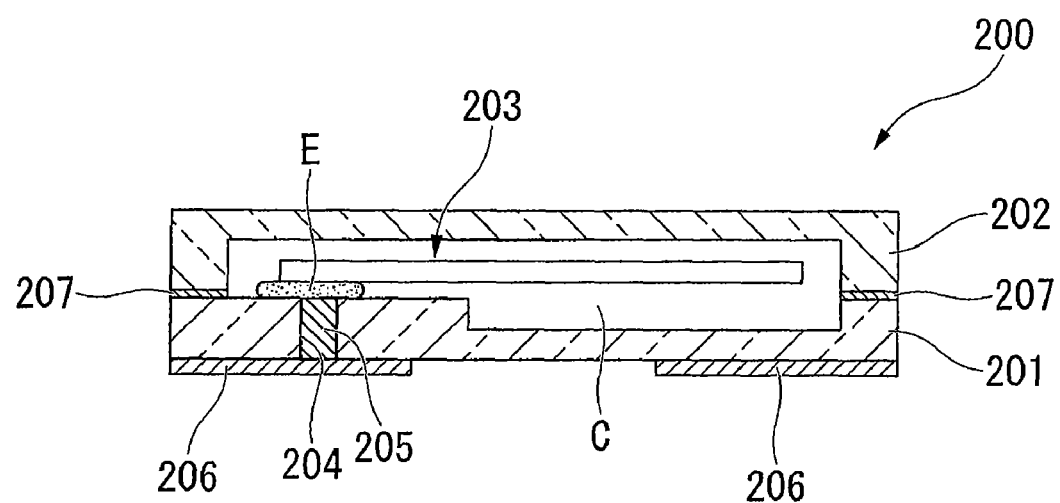
FIG. 34 is a sectional view of the piezoelectric vibrator shown in FIG. 33.

As shown in FIG. 32, a radio-controlled timepiece 130 of the present embodiment includes the piezoelectric vibrators 1 electrically connected to a filter portion 131. The radio-controlled timepiece 130 is a clock provided with the function of displaying the correct time by automatically correcting the time upon receipt of standard radio waves including the clock information.

In Japan, there are transmission centers (transmission stations) that transmit standard radio waves in Fukushima Prefecture (40 kHz) and Saga Prefecture (60 kHz), and each center transmits standard radio waves. Waves as long as 40 kHz or 60 kHz have a property of propagating along the land surface and a property of propagating while reflecting between the ionospheric layer and the land surface, and therefore have a propagation range wide enough to cover all of Japan using the two transmission centers.

Hereinafter, the functional configuration of the radio-controlled timepiece 130 will be described in detail.

An antenna 132 receives long standard radio waves at 40 kHz or 60 kHz. Long standard radio waves are made up of time information called a time code which is modulated by the AM modulation scheme and carried on a carrier wave of 40 kHz or 60 kHz. The received long standard radio waves are amplified by an amplifier 133 and filtered and synchronized by the filter portion 131 having a plurality of piezoelectric vibrators 1.

In the present embodiment, the piezoelectric vibrators 1 include quartz vibrator portions 138 and 139 having resonance frequencies at 40 kHz and 60 kHz which are the same as the above-described carrier frequency.

Furthermore, the filtered signal at the predetermined frequency is detected and demodulated by a detection and rectification circuit 134. Subsequently, the time code is extracted by a waveform shaping circuit 135 and counted by the CPU 136. The CPU 136 reads out information about the current year, the total number of days, the day of the week, and the time. The read information is reflected on the RTC 137 and the precise time information is displayed.

Because the carrier wave is 40 kHz or 60 kHz, a vibrator having the tuning-fork structure described above is suitable for the quartz vibrator portions 138 and 139.

Although the above description has been given of an example in Japan, the frequency of long standard radio waves is different overseas. For example, standard radio waves of 77.5 kHz are used in Germany. When the radio-controlled timepiece 130 operable as well overseas is incorporated into a portable device, the piezoelectric vibrator 1 set at a frequency different from the frequencies used in Japan is required.

According to the radio-controlled timepiece 130 of the present embodiment, since the radio-controlled timepiece includes the high-quality piezoelectric vibrator 1 described above, it is possible to achieve an improvement in the quality of the radio-controlled timepiece itself. In addition to this, it is possible to count the time highly accurately and stably over a long period of time.

It should be noted that the technical scope of the present invention is not limited to the embodiments above, and the present invention can be modified in various ways without departing from the spirit of the present invention.

For example, although the above-described embodiments have been described by way of an example of the grooved piezoelectric vibrating reed 4 in which the groove portions 18 are formed on both surfaces of the vibrating arms 10 and 11 as an example of the piezoelectric vibrating reed 4, the piezoelectric vibrating reed 4 may be a type of piezoelectric vibrating reed without the groove portions 18. However, since the field efficiency between the pair of the excitation electrodes 15 when a predetermined voltage is applied to the pair of excitation electrodes 15 can be increased by forming the groove portions 18, it is possible to suppress the vibration loss further and to improve the vibration properties much more. That is to say, it is possible to decrease the CI value (crystal impedance) further and to improve the performance of the piezoelectric vibrating reed 4 further. In this respect, it is preferable to form the groove portions 18.

In addition, although the above-described embodiment has been described by way of an example of a tuning-fork type piezoelectric vibrating reed 4, the piezoelectric vibrating reed of the present invention is not limited to the tuning-fork type piezoelectric vibrating reed but may be a thickness-shear type piezoelectric vibrating reed, for example.

Moreover, although in the above-described embodiment, the base substrate 2 and the lid substrate 3 are anodically bonded by the bonding film 35, the bonding method is not limited to the anodic bonding. However, anodic bonding is preferable because the anodic bonding can tightly bond the two substrates 2 and 3.

Moreover, although in the above-described embodiment, the piezoelectric vibrating reed 4 is bonded by bumps, the bonding method is not limited to bump bonding. For example, the piezoelectric vibrating reed 4 may be bonded by a conductive adhesive agent. However, since the bump bonding allows the piezoelectric vibrating reed 4 to be floated from the upper surface of the base substrate 2, it is naturally possible to secure the minimum vibration gap necessary for vibration of the piezoelectric vibrating reed 4. Therefore, bump bonding is preferable.

Moreover, although in the above-described embodiment, the base substrate wafer 40 (the base substrate 2) and the rivet members 9 (the penetration electrodes 32 and 33) of which the respective thermal expansion coefficients are approximately the same are used, the thermal expansion coefficients thereof may be different.

Moreover, although in the above-described embodiment, during the penetration hole forming step, the through-holes 30 and 31 are formed so that the opening end on the lower surface side is larger than the opening end on the upper surface side, through-holes having a straight shape in sectional view of which the opening ends on both sides are approximately the same may be formed.

Moreover, although in the above-described embodiment, the fixing jig B is used during the setting step, the fixing jig B may not be used.

Moreover, although in the above-described embodiment, a rivet member in which a plurality of core portions 7 is formed on the same base portion 8 is used as the rivet member 9, a rivet member in which only one core portion 7 extends from the rear surface of the base portion 8 may be used. When the fixing jig is used while using this rivet member, the shape, position, and number of the recess portions in the fixing jig may be changed so as to comply with the rivet member.

Furthermore, although in the above-described embodiment, a rivet member in which the base portion 8 is formed in a rectangular shape in top view is used as the rivet member 9, a rivet member in which the base portion is formed approximately the same size as the base substrate wafer 40 in top view may be used. In this case, by forming the core portions formed on the base portion of the rivet member so as to face all the through-holes 30 and 31 formed on the base substrate wafer 40 when the base substrate wafer 40 and the rivet member are superimposed, the workability of the core portion insertion step can be improved further. Moreover, in this case, since the entirety of the upper surface of the base substrate wafer 40 can be supported without using the fixing jig during the pressing step, it is possible to omit the step of disposing the fixing jig while suppressing cracking of the base substrate wafer 40. Therefore, it is possible to improve the workability of the setting step.

In addition, within a range not deviating from the object of the present invention, constituent elements of the above-described embodiment may be appropriately substituted with well-known constituent elements, and the above-described modified examples may be appropriately combined.

What is claimed is:

1. A method for manufacturing a plurality of piezoelectric vibrators at a time using a base substrate wafer, a lid substrate wafer, a conductive rivet member having a planar base portion and core portions extending from a rear surface of the base portion, the piezoelectric vibrators each including a base substrate, a lid substrate bonded to the base substrate in a state where a cavity is formed between the base substrate and the lid substrate, a piezoelectric vibrating reed bonded to an upper surface of the base substrate in a state of being received in the cavity, outer electrodes formed on a lower surface of the base substrate, and penetration electrodes formed so as to penetrate through the base substrate in a vertical direction so that the piezoelectric vibrating reed is electrically connected to the outer electrodes, the method comprising:
   at the time of forming the penetration electrodes,
   a penetration hole forming step of forming a plurality of penetration holes on the base substrate wafer so as to penetrate through the base substrate wafer in the vertical direction;
   a core portion insertion step of inserting the core portions of the rivet member into the respective penetration holes from one side of the base substrate wafer;
   a melting step of bringing the rear surface of the base portion of the rivet member into contact with the base substrate wafer so as to close an opening end on the one side of the penetration holes, heating the base substrate wafer while pressing the other side of the base substrate wafer so as to melt a surface portion on the other side of the base substrate wafer to produce a liquid base substrate material, and causing the base substrate material to flow into gaps between inner circumferential walls of the penetration holes and the rivet member from the other side of the penetration holes so as to close the gaps;
   a curing step of cooling and curing the base substrate material poured into the gaps to fix the base substrate wafer and the rivet member to be integral with each other; and
   a polishing step of removing the base portion of the rivet member and polishing the base substrate wafer and the rivet member so that the base substrate wafer and the core portion are planarized.

2. The piezoelectric vibrator manufacturing method according to claim 1,
   wherein in the penetration hole forming step, the penetration holes are formed so that the opening end on the other side is larger than the opening end on the one side, and an inner diameter thereof gradually decreases from the other side towards to one side.

3. The piezoelectric vibrator manufacturing method according to claim 1,
   wherein a rivet member in which a plurality of the core portions is formed on the same base portion is used as the rivet member.

4. The piezoelectric vibrator manufacturing method according to claim 1,
   wherein the melting step includes a setting step of disposing the base substrate wafer in which the rivet member is inserted in a recess portion of a receiving mold in which the recess portion is formed so that the base substrate wafer is fitted and received therein in a state where the one side of the base substrate wafer faces the receiving mold, thus bringing the rear surface of the base portion of the rivet member to come into contact with the base substrate wafer; and
   a pressing step of pressing the surface portion on the other side of the base substrate wafer disposed in the recess portion of the receiving mold using a pressurizing mold that applies pressure by pressing the base substrate wafer.

5. The piezoelectric vibrator manufacturing method according to claim 4,
   wherein in the setting step, a fixing jig that forms a flat surface together with the rear surface of the base portion in a state where the base portion of the rivet member is interposed between the base substrate wafer and the fixing jig is disposed between the base substrate wafer and the receiving mold.

6. The piezoelectric vibrator manufacturing method according to claim 4,
wherein a rivet member in which the thickness of the core portion is smaller than that of the base substrate wafer is used as the rivet member.

7. The piezoelectric vibrator manufacturing method according to claim 4,
wherein a pressurizing mold in which a core portion insertion hole having approximately the same inner diameter as the outer diameter of the core portion is formed at a position facing the core portion of the rivet member during the pressing step is used as the pressurizing mold.

8. A piezoelectric vibrator which is manufactured in accordance with the piezoelectric vibrator manufacturing method according to claim 1.

9. An oscillator in which the piezoelectric vibrator according to claim 8 is electrically connected to an integrated circuit as an oscillating piece.

10. An electronic device in which the piezoelectric vibrator according to claim 8 is electrically connected to a timer portion.

11. A radio-controlled timepiece in which the piezoelectric vibrator according to claim 8 is electrically connected to a filter portion.

* * * * *